United States Patent
Sakai

(10) Patent No.: US 9,386,735 B2
(45) Date of Patent: Jul. 5, 2016

(54) ELECTRONIC COMPONENT MOUNTING APPARATUS

(71) Applicant: YAMAHA HATSUDOKI KABUSHIKI KAISHA, Shizuoka (JP)

(72) Inventor: Kiyotaka Sakai, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 243 days.

(21) Appl. No.: 14/150,529

(22) Filed: Jan. 8, 2014

(65) Prior Publication Data

US 2014/0196279 A1    Jul. 17, 2014

(30) Foreign Application Priority Data

Jan. 11, 2013    (JP) ................. 2013-003284

(51) Int. Cl.
     *H05K 13/04*      (2006.01)
     *H05K 13/00*      (2006.01)

(52) U.S. Cl.
     CPC ............ *H05K 13/04* (2013.01); *H05K 13/0061* (2013.01); *Y10T 29/53178* (2015.01)

(58) Field of Classification Search
     CPC ............... H05K 13/04; H05K 13/0061; Y10T 29/53176
     See application file for complete search history.

(56) References Cited

U.S. PATENT DOCUMENTS

| | | | | |
|---|---|---|---|---|
| 5,295,294 | A * | 3/1994 | Ito ................... | H05K 13/021 29/740 |
| 6,971,157 | B1 * | 12/2005 | Yoshida ............. | H05K 13/0452 29/720 |
| 7,331,103 | B2 * | 2/2008 | Kakita .............. | H01L 21/67333 29/426.3 |
| 2004/0033128 | A1 * | 2/2004 | Kabeshita .......... | H05K 13/0061 29/740 |
| 2004/0211059 | A1 * | 10/2004 | Kim ................... | H05K 3/0097 29/832 |

(Continued)

FOREIGN PATENT DOCUMENTS

| | | |
|---|---|---|
| CN | 1430867 A | 7/2003 |
| CN | 101480118 A | 7/2009 |

(Continued)

OTHER PUBLICATIONS

An Office Action issued by the Korean Patent Office on Dec. 22, 2014, which corresponds to Korean Patent Application No. 10-2014-0003383 and is related to U.S. Appl. No. 14/150,529.

(Continued)

*Primary Examiner* — Carl Arbes
(74) *Attorney, Agent, or Firm* — Studebaker & Brackett PC

(57) ABSTRACT

An electronic component mounting apparatus includes a loading unit which loads a printed circuit board. This apparatus includes a first substrate moving unit which moves the printed circuit board, loaded by the loading unit, in the Y-direction. This apparatus includes a substrate holding unit which temporarily holds the printed circuit board moved by the first substrate moving unit. This apparatus includes a component mounting unit which mounts an electronic component on the printed circuit board. This apparatus includes a second substrate moving unit which moves the printed circuit board with the electronic component mounted thereon in the Y-direction. This apparatus includes an unloading unit which moves the printed circuit board, moved by the second substrate moving unit, in the X-direction to unload it. This invention can provide an electronic component mounting apparatus which is compact in its conveyance direction for conveying a printed circuit board.

6 Claims, 20 Drawing Sheets

(56) References Cited

U.S. PATENT DOCUMENTS

| | | | | |
|---|---|---|---|---|
| 2008/0309260 | A1* | 12/2008 | Kanai | .................... H02P 25/06 318/38 |
| 2009/0250313 | A1* | 10/2009 | Kimura | ............. H05K 13/0452 198/465.1 |
| 2009/0277002 | A1 | 11/2009 | Wada et al. | |
| 2013/0283594 | A1 | 10/2013 | Iwaki et al. | |

FOREIGN PATENT DOCUMENTS

| | | |
|---|---|---|
| CN | 101557698 A | 10/2009 |
| JP | H06-252546 A | 9/1994 |
| JP | 2003-078287 A | 3/2003 |
| JP | 2003-163498 A | 6/2003 |
| JP | 4278903 B2 | 3/2009 |
| JP | 2010-232691 A | 10/2010 |
| WO | 2012/096145 A1 | 7/2012 |

OTHER PUBLICATIONS

The First Office Action issued by the Chinese Patent Office on Jan. 27, 2016, which corresponds to Chinese Patent Application No. 201410012658.4 and is related to U.S. Appl. No. 14/150,529.

The extended European search report issued by the European Patent Office on Mar. 1, 2016, which corresponds to European Patent Application No. 13005994.2-1803 and is related to U.S. Appl. No. 14/150,529.

An Office Action; "Notification of Reasons for Refusal," issued by the Japanese Patent Office on Apr. 26, 2016, which corresponds to Japanese Patent Application No. 2013-003284 and is related to U.S. Appl. No. 14/150,529.

* cited by examiner

ELECTRONIC COMPONENT MOUNTING APPARATUS

BACKGROUND OF THE INVENTION

The present invention relates to an electronic component mounting apparatus which mounts an electronic component on a printed circuit board.

A conventional general electronic component mounting apparatus (to be simply referred to as a mounting apparatus hereinafter) includes a conveyance device which horizontally feeds a printed circuit board. Also, in the conventional electronic component mounting apparatus, a printed circuit board loading unit, a substrate holding unit on which a printed circuit board is held at the time of mounting, and a printed circuit board unloading unit are aligned in a line in the conveyance direction of the conveyance device.

An electronic component mounting apparatus of this type adopts a form shown in, for example, Japanese Patent No. 4278903 (to be simply referred to as literature 1 hereinafter) or Japanese Patent Laid-Open No. 2003-163498 (to be simply referred to as literature 2 hereinafter) to obtain a high productivity.

Literature 1 discloses a mounting system formed by aligning a plurality of mounting apparatuses in a line in the conveyance direction.

The mounting apparatus disclosed in literature 1 includes two conveyance devices. These conveyance devices serve to divert a mounting apparatus, that has generated a delay in mounting, of a plurality of mounting apparatuses to feed a printed circuit board to the downstream mounting apparatus. These conveyance devices are aligned in one horizontal direction perpendicular to the conveyance direction. Also, distribution conveyors are connected to the upstream and downstream ends of these conveyance devices to allow selection of a conveyance device to which a printed circuit board is conveyed.

Literature 2 discloses a mounting system formed by aligning a plurality of mounting apparatuses in a line in a horizontal direction perpendicular to the conveyance direction. The conveyance devices for each mounting apparatus disclosed in literature 2 are connected to each other by a loading conveyor and an unloading conveyor. The unloading conveyor can feed printed circuit boards to the upstream ends of all conveyance devices. The unloading conveyor can receive printed circuit boards from the downstream ends of all conveyance devices.

In a conventional general mounting apparatus in which a printed circuit board loading unit, substrate holding unit, and printed circuit board unloading unit are aligned in a line in the conveyance direction of a printed circuit board conveyance device, there is a limit in shortening its dimension in the conveyance direction.

In the mounting apparatus described in literature 1, distribution conveyors must be provided between the plurality of mounting apparatuses, thus increasing its dimension in the conveyance direction.

In the mounting apparatus described in literature 2, a loading conveyor and an unloading conveyor must be provided on the upstream and downstream sides, respectively, thus increasing its size in the conveyance direction.

SUMMARY OF THE INVENTION

The present invention has been made to solve such problems, and has as its object to provide an electronic component mounting apparatus that is compact in the conveyance direction of a conveyance device for conveying a printed circuit board.

In order to achieve the above-mentioned object, according to the present invention, there is provided an electronic component mounting apparatus comprising a loading unit which moves a printed circuit board in a first horizontal direction to load the printed circuit board, a first substrate moving unit which moves the printed circuit board, loaded by the loading unit, in a second horizontal direction perpendicular to the first horizontal direction, a substrate holding unit which temporarily holds the printed circuit board moved by the first substrate moving unit, a component mounting unit which mounts an electronic component on the printed circuit board held by the substrate holding unit, a second substrate moving unit which moves the printed circuit board with the electronic component mounted thereon in the second horizontal direction, and an unloading unit which moves the printed circuit board, moved by the second substrate moving unit, in the first horizontal direction to unload the printed circuit board.

DESCRIPTION OF THE PREFERRED EMBODIMENTS

First Embodiment

An embodiment of an electronic component mounting apparatus according to the present invention will be described in detail below with reference to FIGS. 1 to 3.

Figure 1:
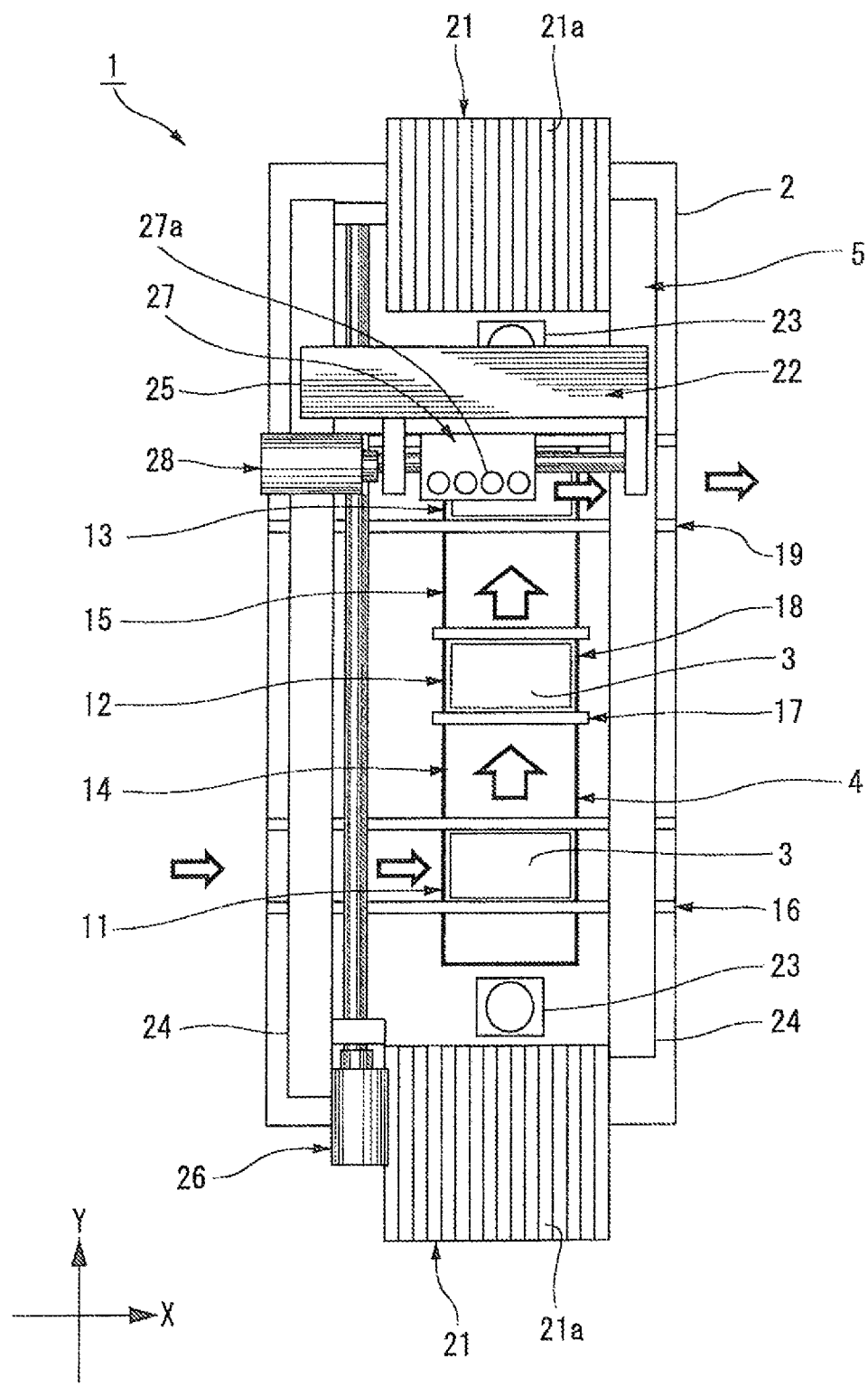
FIG. 1 is a plan view showing the arrangement of an electronic component mounting apparatus according to the first embodiment of the present invention.

An electronic component mounting apparatus 1 shown in FIG. 1 is built by placing various devices (to be described later) on one base 2. Although details will be described later, the various devices include devices that constitute a substrate conveyance unit 4 which conveys a printed circuit board 3, and devices that constitute a component mounting unit 5 which mounts an electronic component (not shown).

Figure 2:
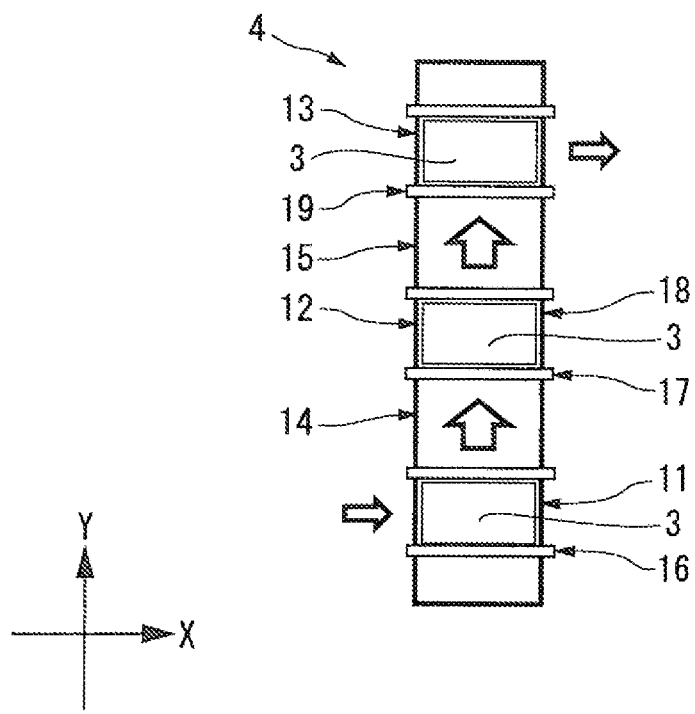
FIG. 2 is a plan view showing the arrangement of a substrate conveyance unit according to the first embodiment of the present invention.

The substrate conveyance unit 4 has a function of conveying the printed circuit board 3 on the base 2 in first and second horizontal directions that are orthogonal to each other, as shown in FIGS. 1 and 2. The first horizontal direction is the direction from the left to the right in FIGS. 1 and 2, and the second horizontal direction is the direction from the bottom to the top in FIGS. 1 and 2. In the following description, the first horizontal direction will be simply referred to as the X-direction, and the second horizontal direction will be simply referred to as the Y-direction. Also, in the following description, the left side will be referred to as the upstream side in the X-direction in FIGS. 1 and 2, and the right side will be referred to as the downstream side in the X-direction in FIGS. 1 and 2. Moreover, in the following description, the lower side will be referred to as the upstream side in the Y-direction in FIGS. 1 and 2, and the upper side will be referred to as the downstream side in the Y-direction in FIGS. 1 and 2.

The substrate conveyance unit 4 includes a loading unit 11, substrate holding unit 12, and unloading unit 13 which are aligned in the Y-direction on the base 2, and a first substrate moving unit 14 and second substrate moving unit 15 which move the printed circuit board 3 in the Y-direction between the units 11, 12, and 13.

The loading unit 11 includes a conveyor 16 for loading the printed circuit board 3. The conveyor 16 is disposed at the upstream end in the Y-direction (the lower end in FIGS. 1 and 2) on the base 2, and traverses the base 2 in the X-direction. The printed circuit board 3 is fed from a device in the previous step to the upstream end in the X-direction on the conveyor 16, and fed onto the base 2 by the conveyor 16. The conveyor 16 feeds the printed circuit board 3 in the X-direction on a predetermined substrate movement surface.

The substrate holding unit 12 includes a conveyor 17 capable of feeding the printed circuit board 3 in the X-direction, and a mounting stage 18 positioned inside the conveyor 17. The mounting stage 18 has a structure which can temporarily hold the printed circuit board 3 on a predetermined substrate support surface. The printed circuit board 3 loaded by the loading unit 11 moves onto the substrate holding unit 12 by a device that constitutes the first substrate moving unit 14 (to be described later).

The first substrate moving unit 14 includes a moving member (not shown) which moves in the Y-direction as the printed circuit board 3 is placed on it. The printed circuit board 3 placed on the moving member moves from the loading unit 11 to the substrate holding unit 12. As the moving member, belts, for example, can be used. The first substrate moving unit 14 has not only a function of moving the moving member in the Y-direction, but also a function of lifting or lowering it. The moving member ascends or descends between a substrate transfer position higher than the substrate movement surface of the loading unit 11 and the substrate support surface of the substrate holding unit 12, and a standby position lower than this substrate movement surface and substrate support surface. The substrate transfer position corresponds to a "first position" according to the invention defined in claim 5, and the standby position corresponds to a "second position" according to the invention defined in claim 5.

The unloading unit 13 includes a conveyor 19 which unloads the printed circuit board 3 in the X-direction from the downstream end in the Y-direction (the upper end in FIGS. 1 and 2) on the base 2. The conveyor 19 traverses the base 2 in the X-direction. The printed circuit board 3 has an electronic component mounted thereon is released by the substrate holding unit 12, and moves to the unloading unit 13 from the substrate holding unit 12 by the second substrate moving unit 15 (to be described later).

The second substrate moving unit 15 includes a guide member (not shown) extending in the Y-direction, and a moving mechanism (not shown). The moving mechanism translates the member (conveyor 17) and mounting stage 18, on which the printed circuit board 3 is placed by the substrate holding unit 12, in the Y-direction together with the printed circuit board 3. The conveyor 17 and mounting stage 18 are movably supported by the guide member extending in the Y-direction, and reciprocally move between a mounting position shown in FIGS. 1 and 2, and an unloading position (not shown) in the unloading unit 13 upon being driven by the moving mechanism. The conveyor 17 of the substrate holding unit 12 moves into the unloading unit 13 to be connected to the conveyor 19 of the unloading unit 13 so that the printed circuit board 3 can be fed to the conveyor 19 of the unloading unit 13.

The component mounting unit 5 mounts an electronic component on the printed circuit board 3 held to the mounting stage 18 mentioned above. The component mounting unit 5 includes component supply devices 21 placed at the upstream and downstream ends of the base 2 in the Y-direction, and a component moving device 22 which moves an electronic component from the component supply device 21 to the printed circuit board 3, as shown in FIG. 1.

The component supply device 21 is built by a large number of tape feeders 21a in this embodiment. A camera 23 for capturing an image of an electronic component from below is provided between the component supply device 21 and the substrate conveyance unit 4.

The component moving device 22 includes a pair of Y beams 24 extending in the Y-direction on the base 2, and an X beam 25 bridging the Y beams 24. The X beam 25 moves in a direction parallel to the Y-direction upon being driven by a Y driving device 26. The X beam 25 is provided with a head unit 27 movable in a direction parallel to the X-direction. The head unit 27 has a plurality of suction heads 27a, and moves in a direction parallel to the X-direction upon being driven by an X driving device 28.

The suction head 27a has a suction nozzle (not shown) at its lower end, and is supported on the head unit 27 to be liftable and rotatable about a vertical axis. The suction heads 27a move between the two component supply devices 21 and the printed circuit board 3 held on the substrate holding unit 12 as the head unit 27 moves in the X- and Y-directions. Therefore, the second substrate moving unit 15 is positioned to fall within the range in which an electronic component can be mounted by the component mounting unit 5.

With the electronic component mounting apparatus 1 configured as described above, the printed circuit board 3 loaded by the loading unit 11 is moved in the Y-direction by the first substrate moving unit 14, fed to the substrate holding unit 12, and held by the substrate holding unit 12. After the printed circuit board 3 is held by the substrate holding unit 12, an electronic component is removed from the component supply devices 21 and mounted on the printed circuit board 3 by the component mounting unit 5. After the end of mounting of the electronic component, the printed circuit board 3 is fed to the unloading unit 13 by the second substrate moving unit 15 and unloaded in the X-direction by the unloading unit 13.

Hence, according to this embodiment, since the printed circuit board 3 is moved in the Y-direction between the loading unit 11 and the unloading unit 13 and placed, an electronic component mounting apparatus compact in the X-direction can be provided.

In this embodiment, the loading unit 11, first substrate moving unit 14, substrate holding unit 12, second substrate moving unit 15, and unloading unit 13 are aligned in a line in the Y-direction. Hence, an electronic component mounting apparatus more compact in the X-direction can be provided by adopting this embodiment.

The second substrate moving unit 15 according to this embodiment includes a moving mechanism which translates the member (conveyor 17), on which the printed circuit board 3 is placed, together with the printed circuit board 3 along a guide member extending in the Y-direction.

With this arrangement, a printed circuit board 3 on which a component has been mounted can be moved in the Y-direction and fed to the unloading unit 13 without being affected by large vibration. Hence, according to this embodiment, when a printed circuit board 3 with a component mounted thereon moves in the Y-direction, the electronic component does not shift from the position at which it was mounted due to vibration or impact, so an electronic component mounting apparatus capable of high-quality component mounting can be provided.

The first substrate moving unit 14 according to this embodiment uses a moving member which moves in the Y-direction to feed the printed circuit board 3 from the loading unit 11 to the substrate holding unit 12. The moving member ascends or descends between a substrate transfer position higher than the substrate movement surface of the loading unit 11 and the substrate support surface of the substrate holding unit 12, and a standby position lower than this substrate movement surface and substrate support surface.

With this arrangement, while the printed circuit board 3 is positioned in the loading unit 11, the moving member ascends from the standby position to the substrate transfer position and moves in the Y-direction to feed the printed circuit board 3 to the substrate holding unit 12 at once while avoiding interference between the loading unit 11 and the substrate holding unit 12.

Therefore, according to this embodiment, since the printed circuit board 3 can be quickly fed from the loading unit 11 to the substrate holding unit 12, an electronic component mounting apparatus with a higher productivity can be provided.

The second substrate moving unit 15 according to this embodiment is positioned to fall within the range in which an electronic component can be mounted by the component mounting unit 5.

Hence, according to this embodiment, an electronic component can be mounted on the printed circuit board 3 by the component mounting unit 5 between the substrate holding unit 12 and the unloading unit 13 as well.

Modification to First Embodiment

Figure 3:
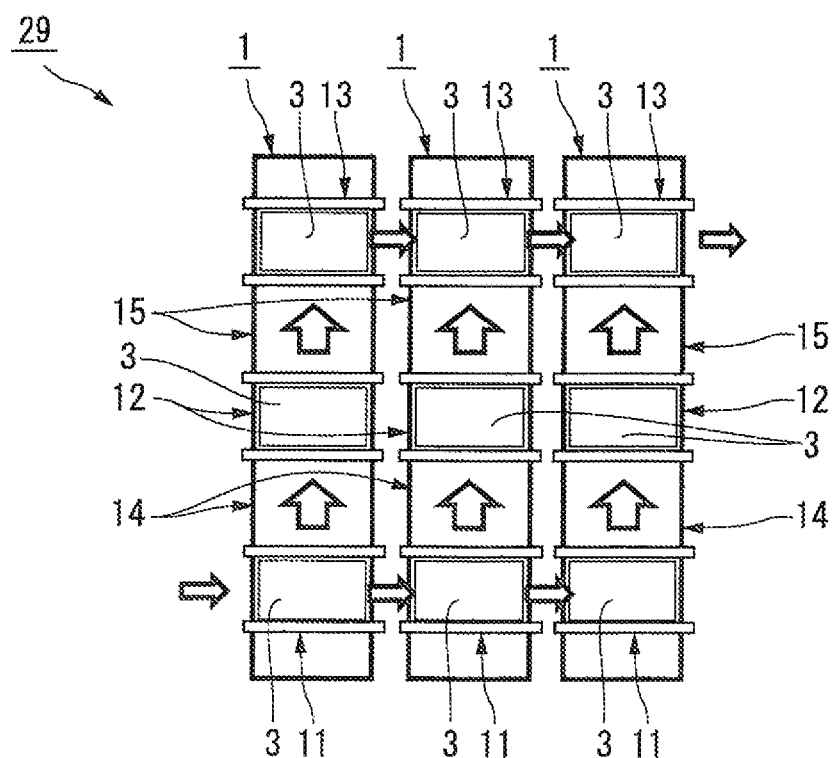
FIG. 3 is a plan view of a mounting system built using the substrate conveyance unit according to the first embodiment of the present invention.

An electronic component mounting apparatus according to this modification can be used to build a mounting system, as shown in FIG. 3.

A mounting system 29 shown in FIG. 3 is formed by aligning a plurality of (three) electronic component mounting apparatuses 1 in the X-direction. Note that FIG. 3 does not illustrate a component mounting unit 5 of each electronic component mounting apparatus 1. Loading units 11 of the electronic component mounting apparatuses 1 are connected to each other so as to feed a printed circuit board 3 in the X-direction. Also, unloading units 13 of the electronic component mounting apparatuses 1 are connected to each other so as to feed a printed circuit board 3 in the X-direction.

With the mounting system 29 shown in FIG. 3, the printed circuit board 3 can be fed to all electronic component mounting apparatuses 1 using the loading unit 11 of each electronic component mounting apparatus 1. Again, with the mounting system 29, the printed circuit board 3 can be unloaded from all electronic component mounting apparatuses 1 using the unloading unit 13 of each electronic component mounting apparatus 1. The printed circuit board 3 moves in the Y-direction from the loading unit 11 in each electronic component mounting apparatus 1 and is fed to the substrate holding unit 12.

Hence, according to this modification, since the printed circuit board 3 can be fed to a plurality of electronic component mounting apparatuses 1 without requiring a distribution conveyor as described above in literature 1 or 2, a mounting system compact in the X-direction can be obtained.

Especially, according to this modification, loading of a printed circuit board 3, mounting of an electronic component, and unloading of the printed circuit board 3 can be independently done in each electronic component mounting apparatus 1 without influencing the mounting states of other electronic component mounting apparatuses 1. Hence, according to this modification, a mounting system which not only is compact in the X-direction but also has a high mounting efficiency can be provided.

Second Embodiment

An embodiment of an electronic component mounting apparatus according to the invention defined in claim 2 will be described in detail with reference to FIGS. 4 to 6. The same reference numerals as described with reference to FIGS. 1 to 3 denote the same or similar members in FIGS. 4 to 6, and a detailed description thereof will be omitted as needed.

Figure 4:
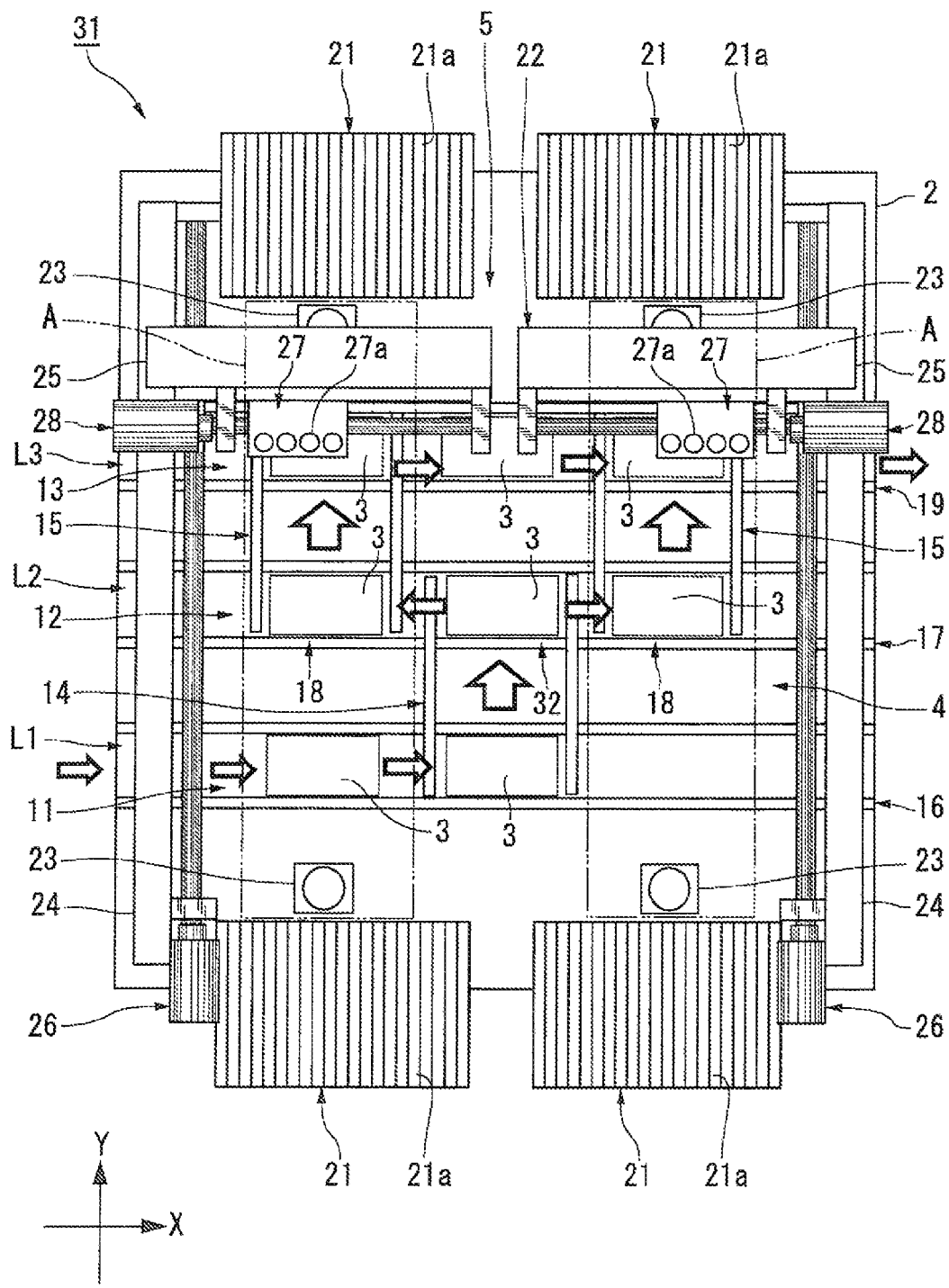
FIG. 4 is a plan view showing the arrangement of an electronic component mounting apparatus according to the second embodiment of the present invention.
Figure 5:
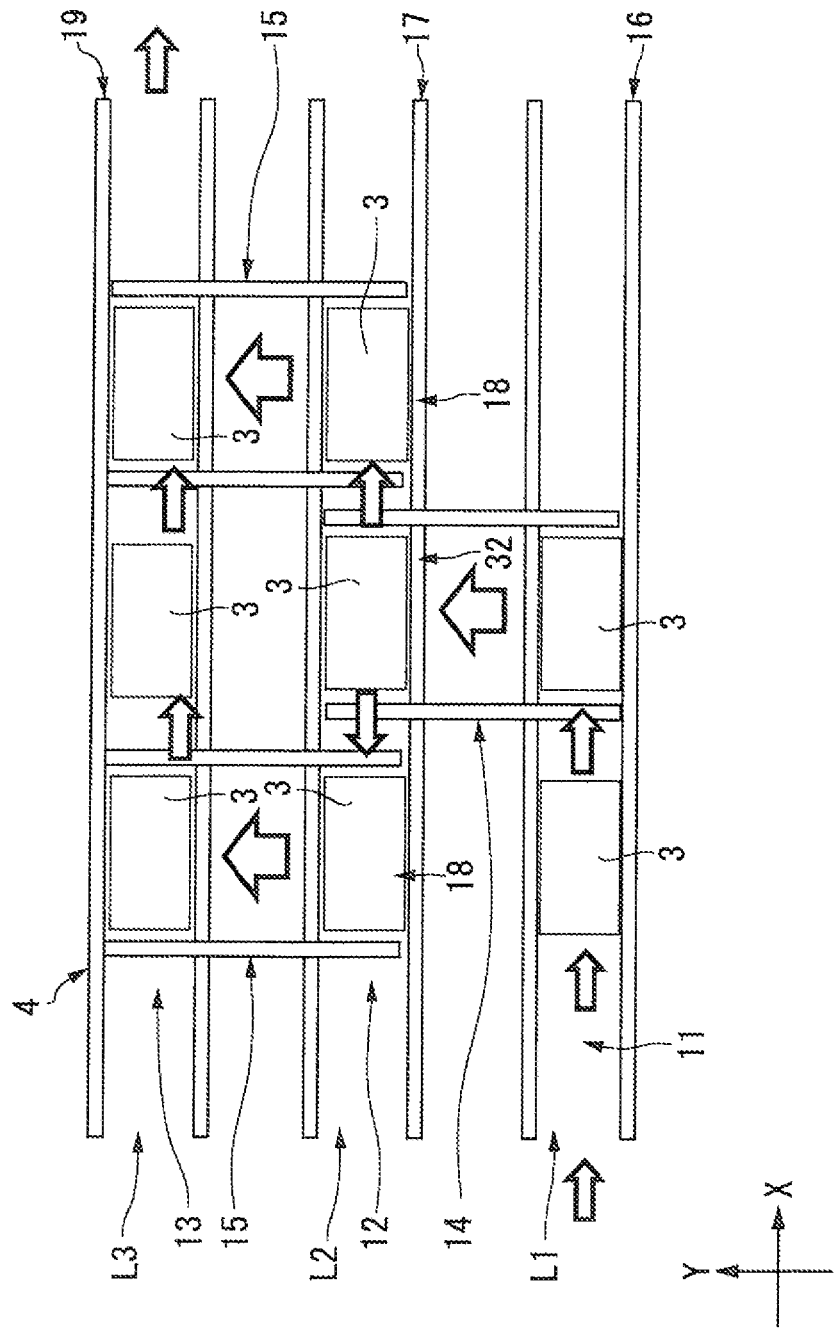
FIG. 5 is a plan view showing the arrangement of a substrate conveyance unit according to the second embodiment of the present invention.

A substrate conveyance unit 4 of an electronic component mounting apparatus 31 shown in FIG. 4 can feed a printed circuit board 3 to the downstream and upstream sides in the X-direction in a substrate holding unit 12. That is, the substrate conveyance unit 4 includes a first conveyance lane (conveyance path) L1 formed by a loading unit 11, a second conveyance lane L2 formed by the substrate holding unit 12, and a third conveyance lane L3 formed by an unloading unit 13 so as to be aligned in the Y-direction in this order.

The second conveyance lane L2 (substrate holding unit 12) is built by a moving direction change conveyor 32 positioned at the center of a base 2 in the X-direction, and a conveyor 17 and mounting stage 18 provided on each side of the moving direction change conveyor 32. In this embodiment, a "first conveyor" according to the invention defined in claim 2 is implemented by the moving direction change conveyor 32.

The moving direction change conveyor 32 rotates a pair of belts extending parallel to the X-direction to feed the printed circuit board 3 in a direction parallel to the X-direction. The printed circuit board 3 is fed from the first conveyance lane (conveyance path) L1 to the second conveyance lane L2 by a first substrate moving unit 14, and then fed to the downstream side in the X-direction (the right side in FIGS. 4 and 5) or the upstream side in the X-direction (the left side in FIGS. 4 and 5) by the moving direction change conveyor 32. That is, the moving direction change conveyor 32 changes the conveyance direction of the printed circuit board 3 fed by the first substrate moving unit 14 to the X-direction or a direction opposite to the X-direction.

The mounting stage 18 according to this embodiment is equivalent to that shown in the first embodiment, and the printed circuit board 3 fed by the moving direction change conveyor 32 and conveyor 17 on the second conveyance lane L2 are temporarily held.

A second substrate moving unit 15 according to this embodiment is provided on each side of the moving direction change conveyor 32, and feeds the mounting stage 18 in the Y-direction.

That is, the mounting stage 18 is reciprocally moved between the second conveyance lane L2 and the third conveyance lane L3 by the second substrate moving unit 15.

The unloading unit 13 according to this embodiment adopts an arrangement which feeds, in the X-direction, the printed circuit board 3 fed to the third conveyance lane L3 by one second substrate moving unit 15, and the printed circuit board 3 fed to the third conveyance lane L3 by the other second substrate moving unit 15.

A component mounting unit 5 according to this embodiment includes two head units 27, as shown in FIG. 4. The head units 27 are supported by X beams 25 to be movable in the X-direction. The X beam 25 for each head unit is supported by a Y beam 24 to be movable in a direction parallel to the Y-direction. FIG. 4 does not illustrate Y beams which support the adjacent ends of the two X beams 25. The range in which each head unit 27 can mount a component includes the second substrate moving unit 15, as indicated by an alternate long and two short dashed line A in FIG. 4.

In the electronic component mounting apparatus 31 according to this embodiment, the printed circuit board 3 is fed from the first conveyance lane (conveyance path) L1 (loading unit 11) to the second conveyance lane L2 by the first substrate moving unit 14. The printed circuit board 3 is fed to one mounting stage 18 or the other mounting stage 18 by the moving direction change conveyor 32 on the second conveyance lane L2.

Hence, according to this embodiment, since a plurality of mounting stages 18 are used so as to mount an electronic component on the printed circuit board 3, an electronic component mounting apparatus with a higher mounting efficiency can be provided.

Also, since the electronic component mounting apparatus 31 distributes printed circuit boards 3 to two mounting stages 18 using the moving direction change conveyor 32, only one first substrate moving unit 14 needs to be used despite the provision of a plurality of mounting stages 18. This makes it possible to keep the manufacturing cost relatively low, compared to a case wherein the first substrate moving unit 14 is provided for each mounting stage 18.

Modification to Second Embodiment

Figure 6:
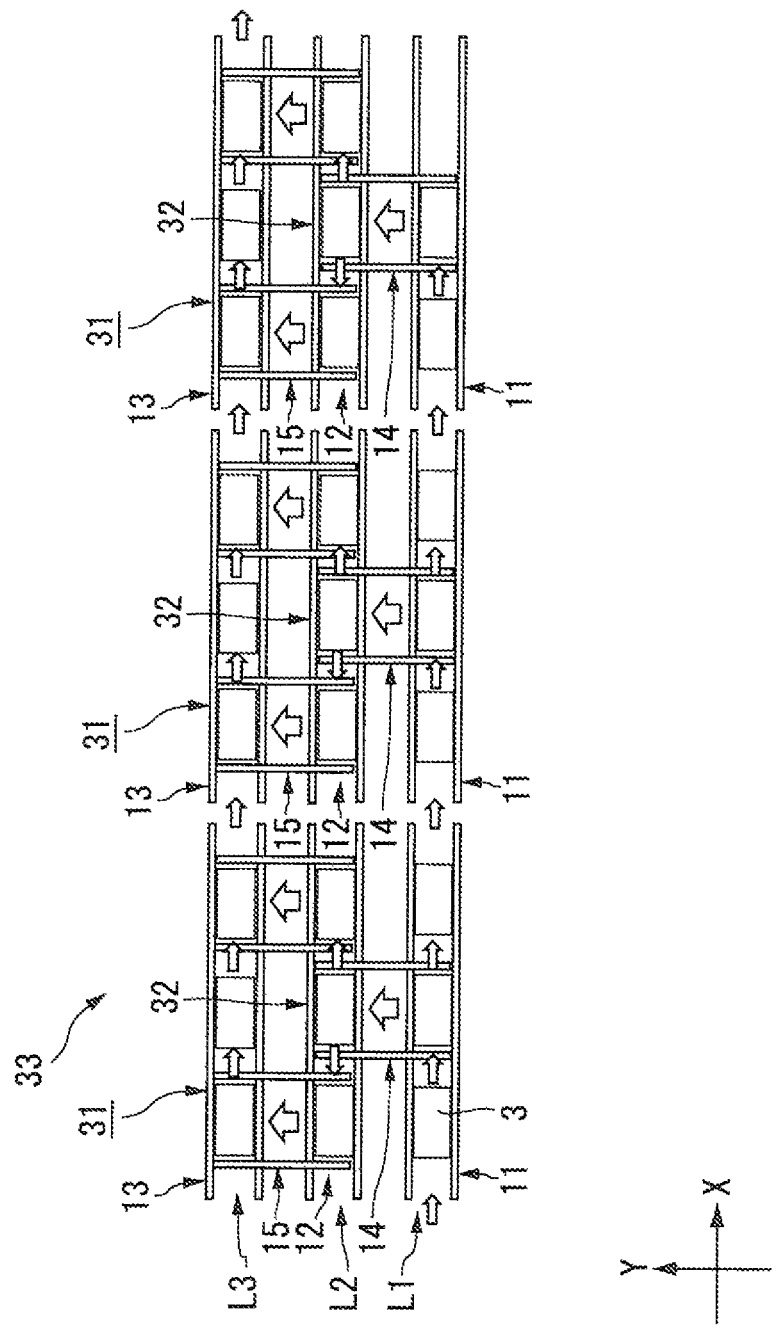
FIG. 6 is a plan view of a mounting system built using the substrate conveyance unit according to the second embodiment of the present invention.

An electronic component mounting apparatus 31 according to this embodiment can be used to build a mounting system, as shown in FIG. 6.

A mounting system 33 shown in FIG. 6 is built by aligning a plurality of (three) electronic component mounting apparatuses 31 according to the second embodiment in the X-direction. Note that FIG. 6 does not illustrate a component mounting unit 5 of each electronic component mounting apparatus 31. Loading units 11 of the electronic component mounting apparatuses 31 are connected to each other so as to feed a printed circuit board 3 in the X-direction. Also, unloading units 13 of the electronic component mounting apparatuses 31 are connected to each other so as to feed a printed circuit board 3 in the X-direction.

When this embodiment is adopted as well, since the printed circuit board 3 can be fed to a plurality of electronic component mounting apparatuses 31 without requiring a distribution conveyor as described above in literature 1 or 2, a mounting system compact in the X-direction can be obtained.

Also, in this modification as well, loading of a printed circuit board 3, mounting of an electronic component, and unloading of the printed circuit board 3 can be independently done in each electronic component mounting apparatus 31 without influencing the mounting states of other electronic component mounting apparatuses 31. Hence, according to this modification as well, a mounting system which not only is compact in the X-direction but also has a high mounting efficiency can be provided.

Third Embodiment

Figure 7:
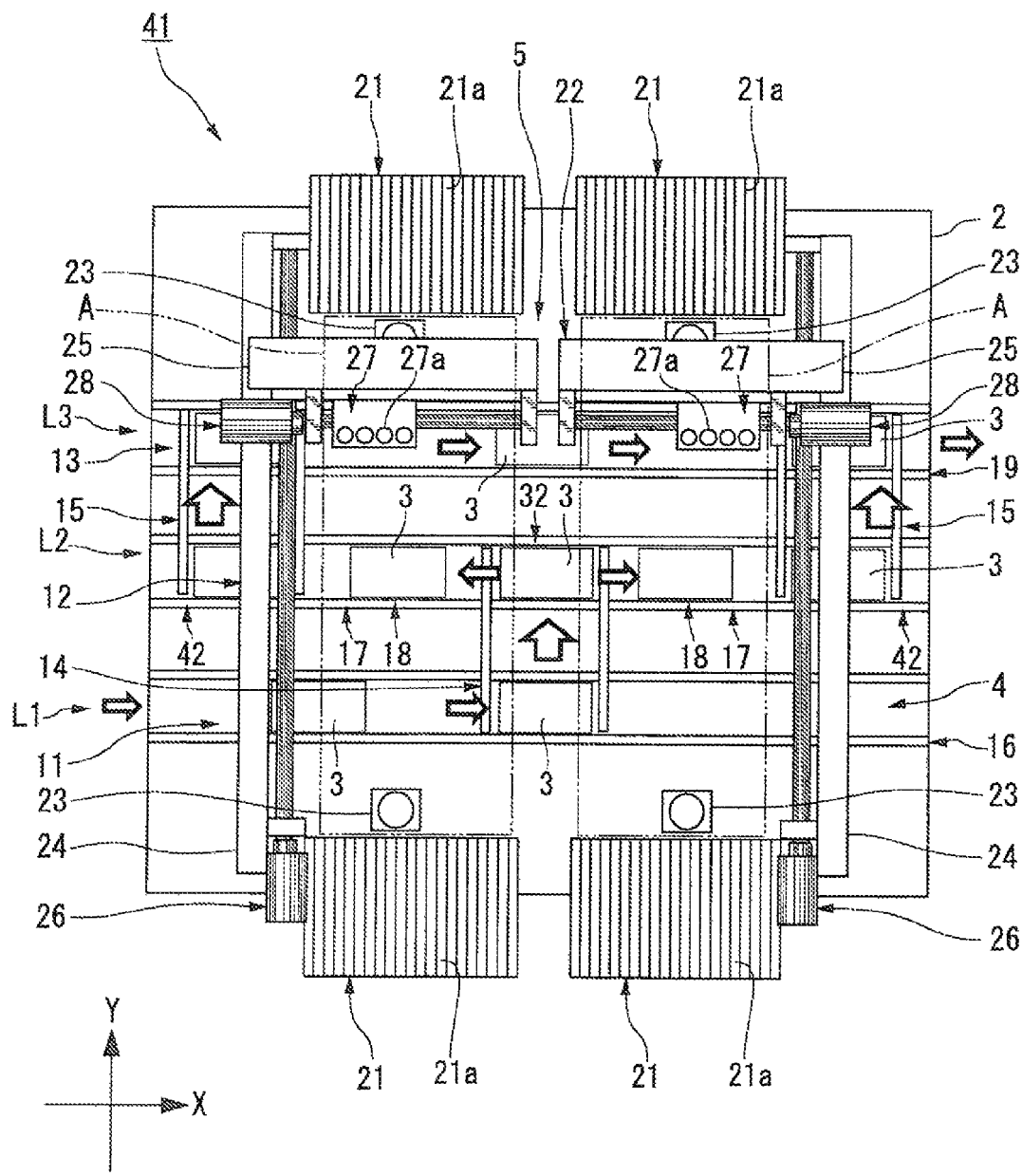
FIG. 7 is a plan view showing the arrangement of an electronic component mounting apparatus according to the third embodiment of the present invention.
Figure 8:
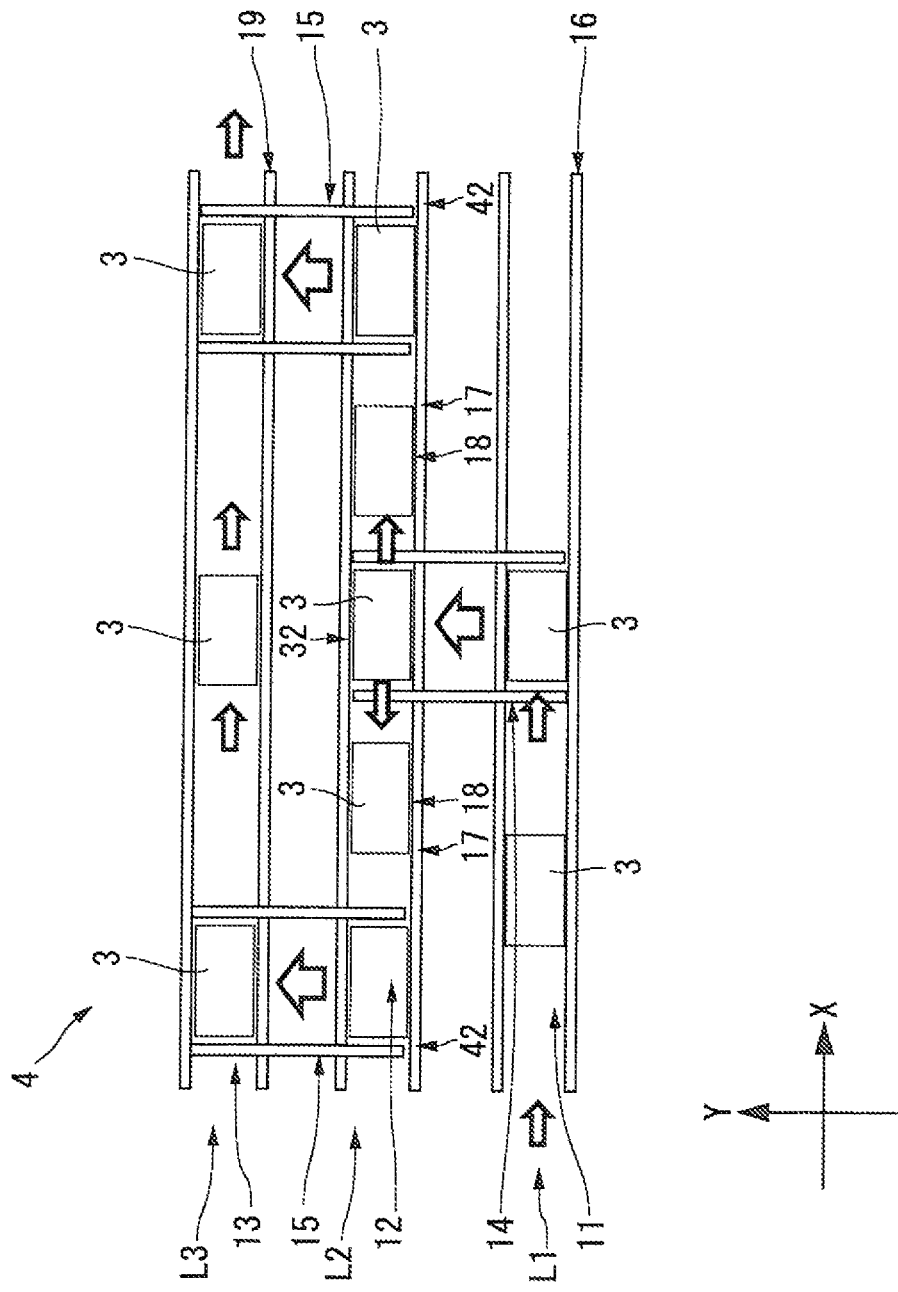
FIG. 8 is a plan view showing the arrangement of a substrate conveyance unit according to the third embodiment of the present invention.

Two second substrate moving units when two mounting stages are provided can be configured as shown in FIGS. 7 and 8. The same reference numerals as described with reference to FIGS. 1 to 6 denote the same or similar members in FIGS. 7 and 8, and a detailed description thereof will be omitted as needed.

Two second substrate moving units 15 of an electronic component mounting apparatus 41 shown in FIGS. 7 and 8 are provided on the outer side of a base 2 with respect to two mounting stages 18 and at the two ends of a second conveyance lane L2. The mounting stages 18 according to this embodiment are held to the base 2 so as not to move in either the X- or Y-direction.

In the second substrate moving unit 15, the mounting stage 18 includes conveyors 42 to which a printed circuit board 3 is fed from conveyors 17 positioned inside. The printed circuit board 3 with an electronic component mounted thereon by the mounting stage 18 is moved into the second substrate moving unit 15 by the conveyors 17 and the conveyors 42 of the second substrate moving unit 15. The conveyors 42 of the second substrate moving unit 15 are translated by the above-mentioned moving mechanism to reciprocally move between the second conveyance lane L2 and a third conveyance lane L3.

The second substrate moving unit 15 according to this embodiment is different from those shown in the above-mentioned first and second embodiments, and translates the conveyors 42 instead of translating the mounting stage 18. Hence, according to this embodiment, since the load of the moving mechanism is reduced, the cost can be reduced using a low-output motor for driving the moving mechanism.

The electronic component mounting apparatus 41 according to this embodiment can be used to build a mounting system (not shown). This mounting system is built by aligning a plurality of electronic component mounting apparatuses 41 in the X-direction, and connecting them to each other so as to transfer the printed circuit board 3.

(Description of Detailed Structure)

The detailed structure of the main part of the electronic component mounting apparatus 41 according to this embodiment will be described in detail below with reference to FIGS. 9 to 25. The substrate conveyance unit 4 of the electronic component mounting apparatus 41 according to this embodiment can convey a flexible film-like printed circuit board 3 (see FIG. 9). The printed circuit board 3 is formed in a rectangular shape as viewed in a plan view.

A loading unit 11 and unloading unit 13 of a substrate conveyance unit 4 according to this embodiment are implemented by conveyors 16 and 19. The conveyors 16 and 19 of the loading unit 11 and unloading unit 13 are formed to support two side portions, as the long sides, of the printed circuit board 3 formed in a rectangular shape, and extend from the upstream to downstream ends of the base 2 in the X-direction.

Figure 10:
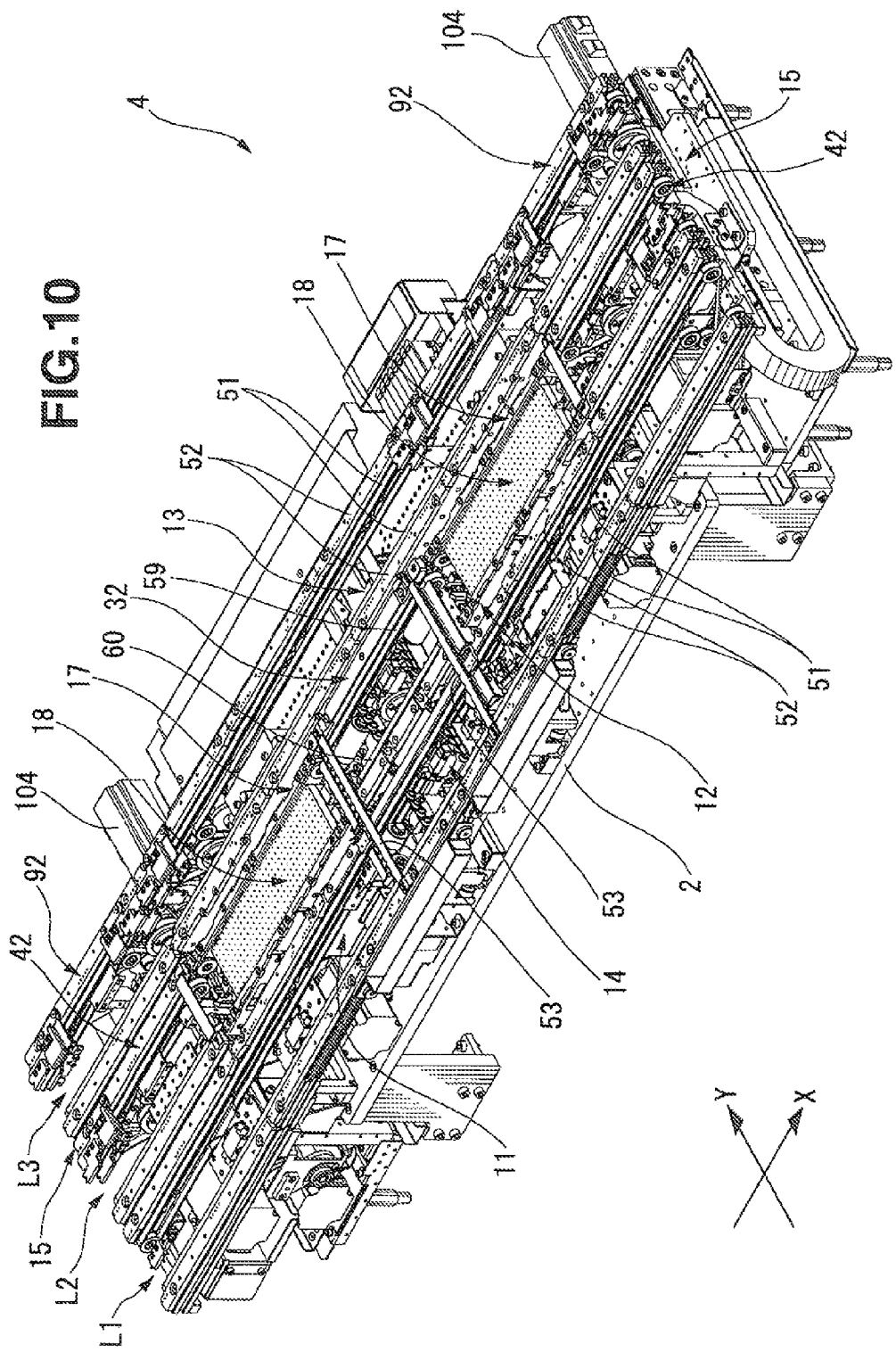
FIG. 10 is a perspective view illustrating a practical example of the substrate conveyance unit.

A pair of belts 51 of the conveyors 16 and 19 are supported by belt frames 52 extending in the X-direction, as shown in FIG. 10. The belt frames 52 are supported by the base 2 while being spaced apart from the base 2 by a predetermined distance upwards.

A first substrate moving unit 14 is provided at a position corresponding to the center of the loading unit 11 in the longitudinal direction on the base 2. Also, a moving direction change conveyor 32 and the mounting stage 18 of a substrate holding unit 12, and the conveyors 42 of the second substrate moving unit 15 are provided between the loading unit 11 and the unloading unit 13 to build the second conveyance lane L2.

Figure 9:
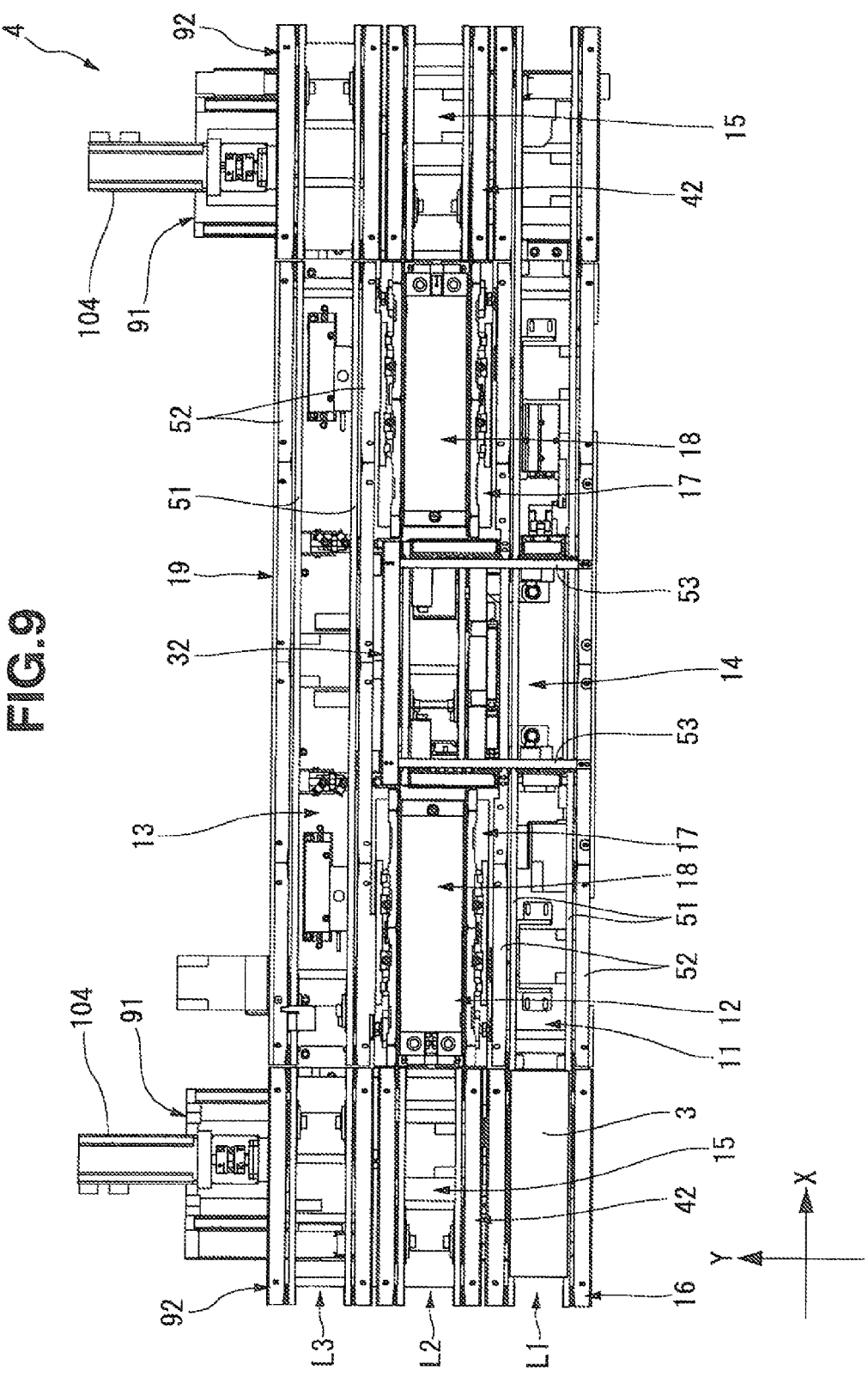
FIG. 9 is a plan view illustrating a practical example of the substrate conveyance unit.

The first substrate moving unit 14 includes a pair of pressure receiving members 53 extending in the Y-direction, as shown in FIGS. 9 and 10. The pressure receiving members 53 serve to regulate an upward displacement of the printed circuit board 3 when the printed circuit board 3 is fed in the Y-direction by the first substrate moving unit 14.

The pressure receiving members 53 are spaced apart from each other by a distance corresponding to the length of each long side of the printed circuit board 3. The pressure receiving members 53 are positioned above the belts 51 of the loading unit 11, and held to belt frames 52 of the loading unit 11, and a belt frame 54 (see FIGS. 11 and 12) of the moving direction change conveyor 32 (to be described later).

Figure 11:
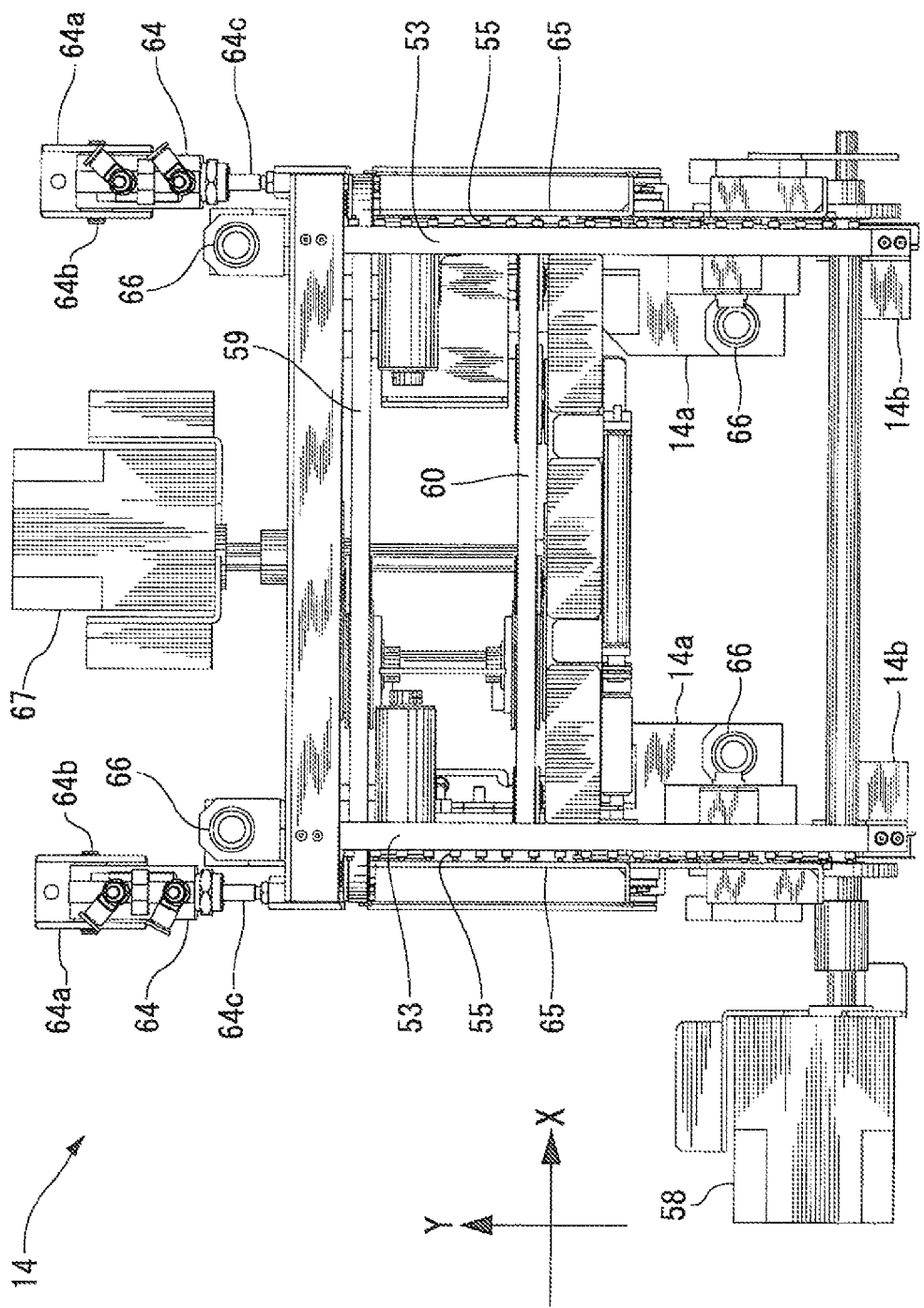
FIG. 11 is a plan view of a first substrate moving unit.
Figure 12:
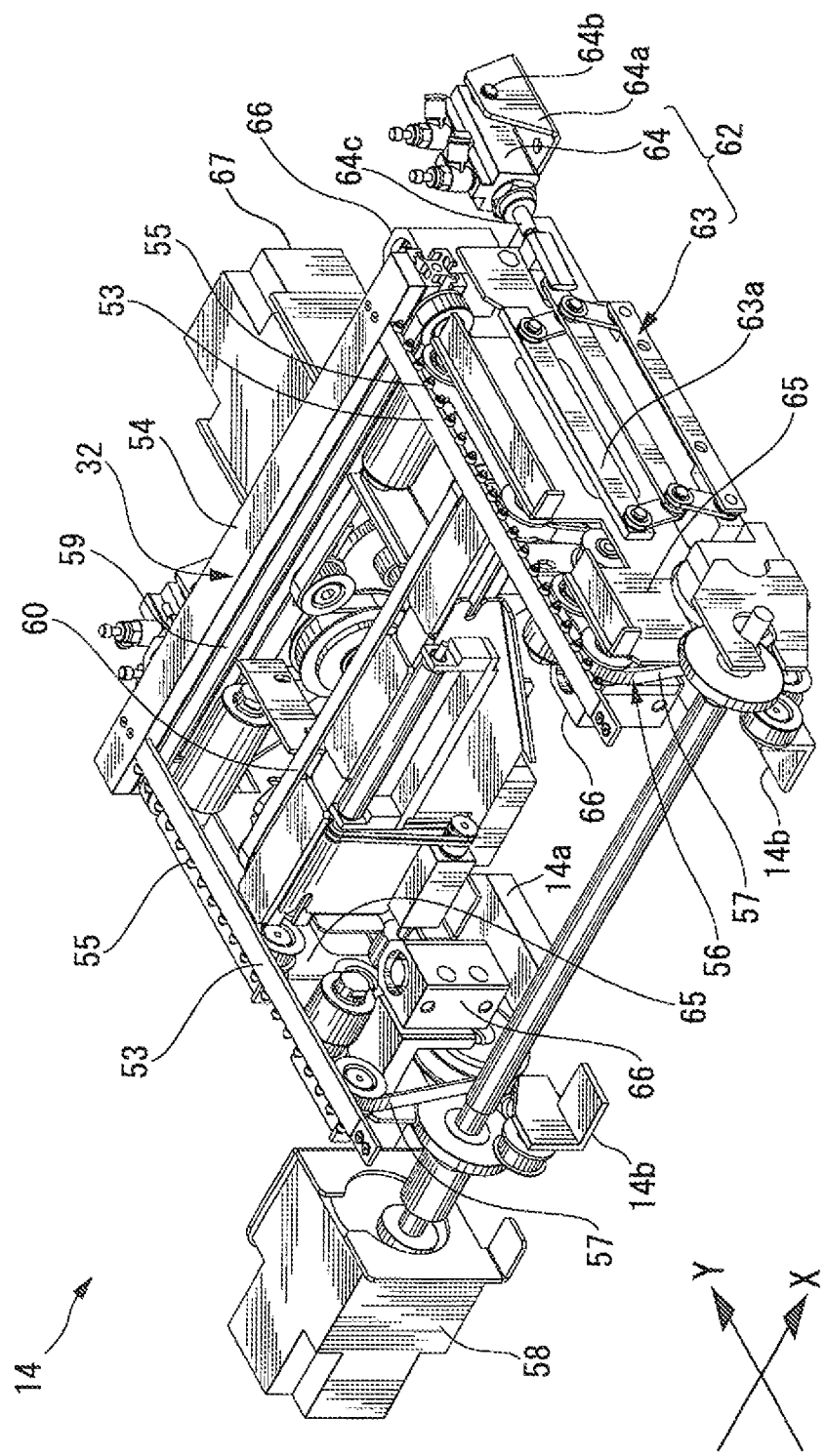
FIG. 12 is a perspective view of the first substrate moving unit.

The pressure receiving members 53 are provided with a large number of rollers 55, as shown in FIGS. 11 and 12.

Figure 14:
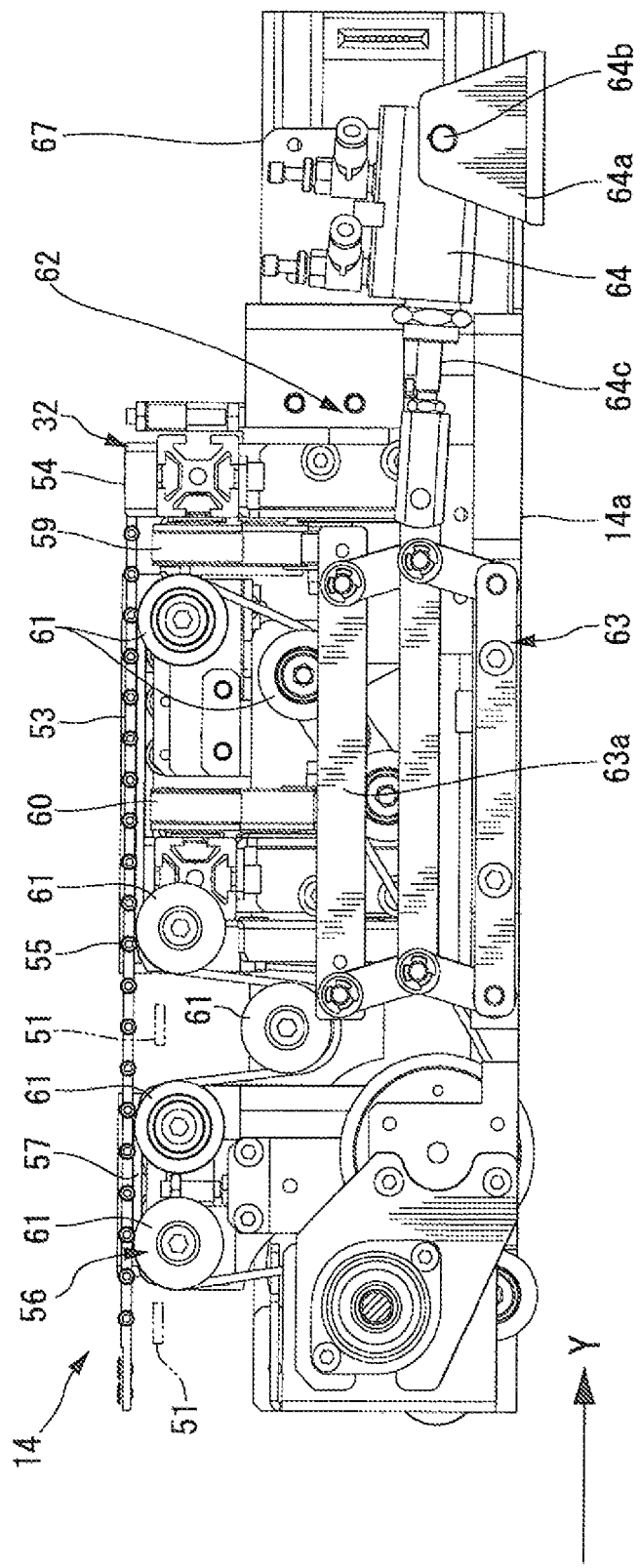
FIG. 14 is a sectional view for explaining the internal structure of the first substrate moving unit, and shows the state where belts are lifted.
Figure 15:
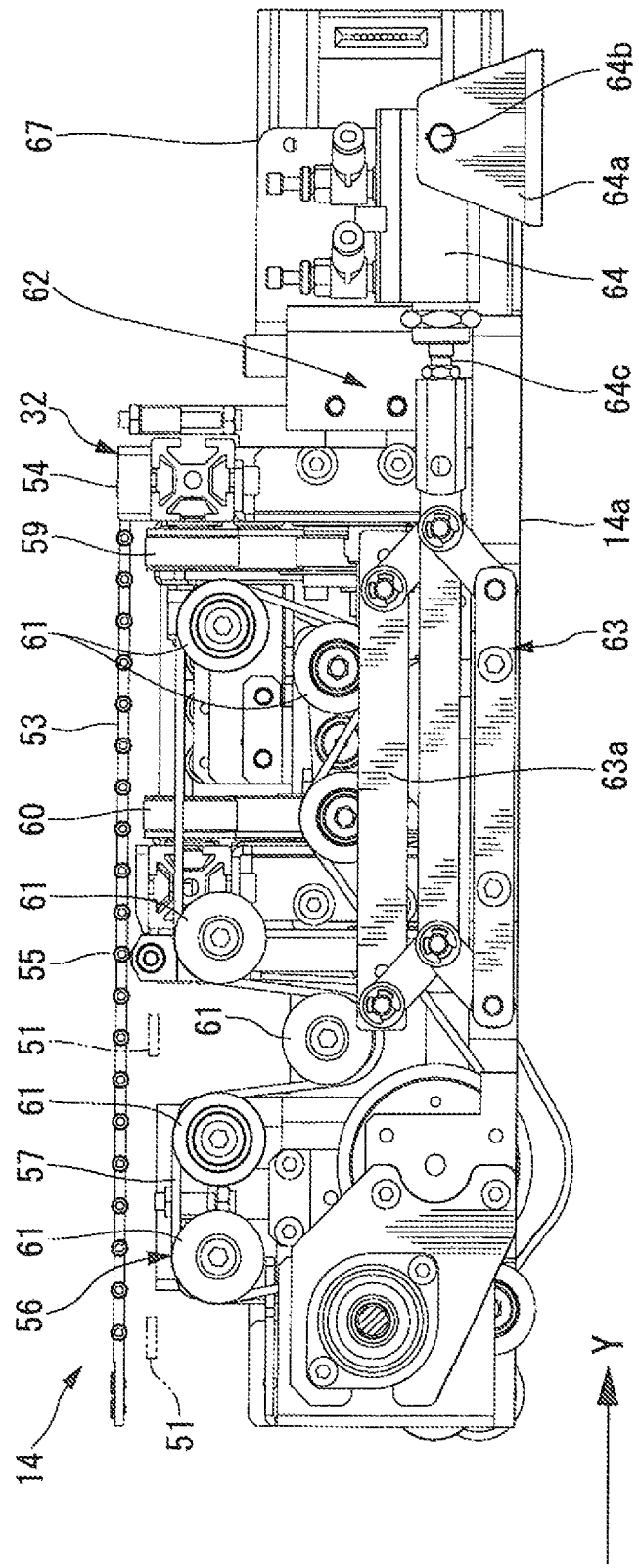
FIG. 15 is a sectional view for explaining the internal structure of the first substrate moving unit, and shows the state where belts are lowered.

A conveyor 56 is provided below the pair of pressure receiving members 53, as shown in FIGS. 12, 14, and 15. The conveyor 56 serves to move the printed circuit board 3 in the Y-direction to feed it from the loading unit 11 to the moving direction change conveyor 32 of a substrate holding unit 12 (to be described later).

The conveyor 56 serves to rotate a pair of belts 57 so that their upper portions move in the Y-direction. In this embodiment, the belts 57 correspond to a "moving member" according to the invention defined in claim 5.

The belts 57 of the conveyor 56 are driven by one driving motor 58 (see FIGS. 11 and 12). The upper portions of the belts 57 divert the belts 51 of the loading unit 11 downwards to extend in the Y-direction, and are guided downwards on the upstream side, in the Y-direction, of a first belt 59 of the moving direction change conveyor 32, as shown in FIG. 14. The moving direction change conveyor 32 includes the first belt 59, and a second belt 60 positioned upstream of the first belt 59 in the Y-direction. The second belt 60 is positioned between the two belts 57 of the first substrate moving unit 14 to extend in the X-direction.

Figure 13:
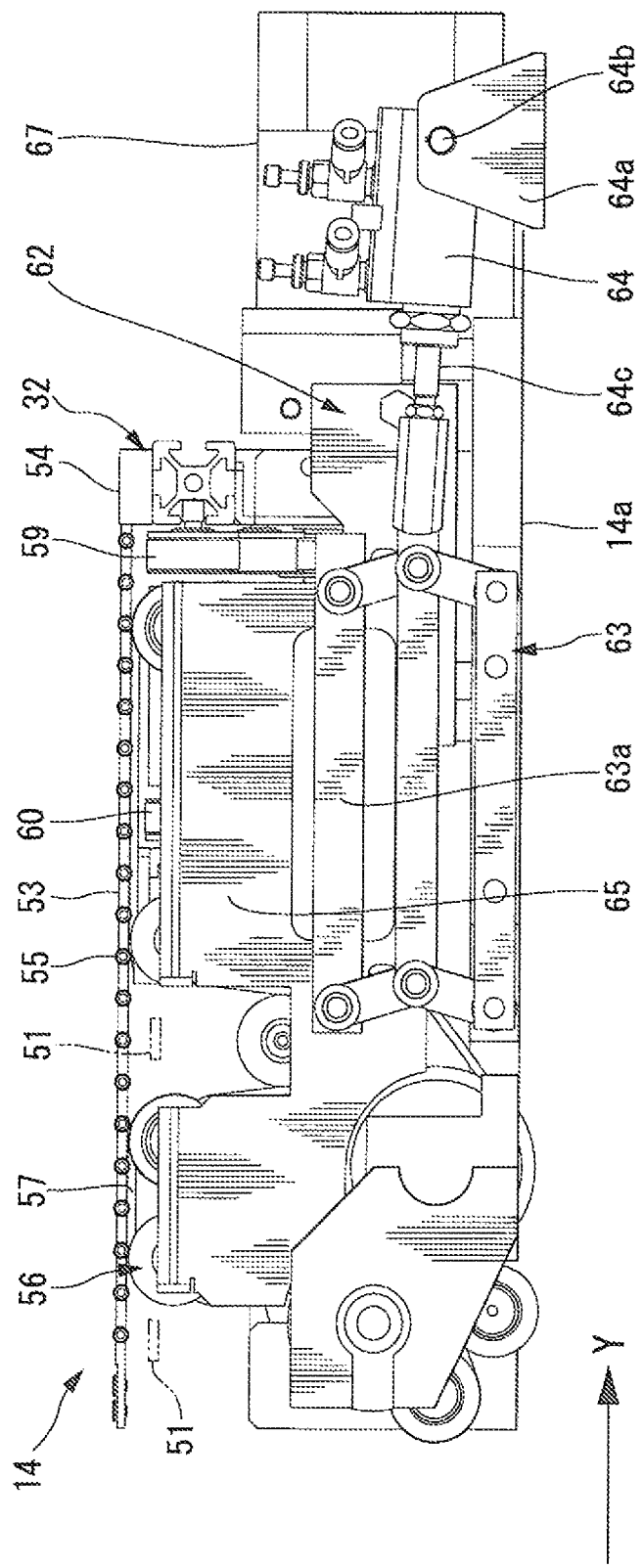
FIG. 13 is a side view of the first substrate moving unit.

A plurality of pulleys 61 which support at least the upper portions of the belts 57 in the conveyor 56 of the first substrate moving unit 14 are connected to a lift mechanism denoted by reference numeral 62 in FIGS. 13 to 15. The lift mechanism 62 is implemented by a parallel linkage mechanism 63, and an air cylinder 64 connected to the parallel linkage mechanism 63. An upper link 63a of the parallel linkage mechanism 63 is connected to a support plate 65 (see FIGS. 11 to 13) which supports the pulleys 61. The support plate 65 is movably supported by a frame member 14a of the first substrate moving unit 14. The direction in which the support plate 65 moves is regulated only vertically by a guide member 66 (see FIGS. 11 and 12). The frame member 14a is held to the base 2 by a plurality of attachment brackets 14b (see FIGS. 11 and 12).

The air cylinder 64 has its one end supported to be vertically swingable, and its other end supported by a support bracket 64a through a support shaft 64b. The support bracket 64a is held to the base 2. The support shaft 64b extends in a direction parallel to the X-direction, and passes through the trailing end of the air cylinder 64, that is, its end opposite to a piston rod 64c.

The support plate 65 which supports the pulleys 61 ascends together with the upper link 63a as the piston rod 64c of the air cylinder 64 extends, as shown in FIG. 14. At this time, the air cylinder 64 swings about the support shaft 64b so as to set the piston rod 64c at a relatively high position. In this state, the two belts 57 of the first substrate moving unit 14 ascend to a substrate transfer position higher than the substrate movement surface (the upper surface of the belts 51) of the loading unit 11, and the substrate support surface (the upper surfaces of the first and second belts 59 and 60) of the moving direction change conveyor 32.

Also, the support plate 65 which supports the pulleys 61 descends together with the upper link 63a as the piston rod 64c retracts, as shown in FIG. 15. At this time, the air cylinder 64 swings about the support shaft 64b so as to set the piston rod 64c at a relatively low position. In this state, the belts 57 ascend to a substrate transfer position lower than the substrate movement surface of the loading unit 11, and the substrate support surface of the moving direction change conveyor 32.

The belts 57 of the first substrate moving unit 14 descend to a standby position when the printed circuit board 3 is fed in the X-direction by the belts 51 of the loading unit 11. The belts 57 of the first substrate moving unit 14 ascend to a substrate transfer position while the printed circuit board 3 is fed to a position corresponding to the first substrate moving unit 14 by the belts 51 of the loading unit 11. With this arrangement, as the belts 57 ascend to the substrate transfer position, the printed circuit board 3 moves from the loading unit 11 to the first substrate moving unit 14 upon ascent together with the belts 57. At this time, the side portions, as short sides, of the printed circuit board 3 are placed on the belts 57.

In this ascended state, the upper surface of the printed circuit board 3 is pressed from below by the rollers 55 of the pressure receiving members 53 to regulate a further upward displacement of the printed circuit board 3. The printed circuit board 3 is fed in the Y-direction to a position above the moving direction change conveyor 32, while being clamped by the belts 57 and the rollers 55, as the belts 57 of the first substrate moving unit 14 rotate. The belts 57 of the first substrate moving unit 14 descend to a standby position after the printed circuit board 3 moves to a position above the moving direction change conveyor 32. With this arrangement, the printed circuit board 3 is placed on the first and second belts 59 and 60 of the moving direction change conveyor 32 as the belts 57 descend.

The first and second belts 59 and 60 of the moving direction change conveyor 32 are arranged so as to support the side portions, as the long sides, of the printed circuit board 3. Also, the first and second belts 59 and 60 are rotated in the forward or reverse direction by one driving motor 67 (see FIGS. 11 and 12). That is, the printed circuit board 3 placed on the first and second belts 59 and 60 is fed to the downstream or upstream side in the X-direction.

Figure 16:
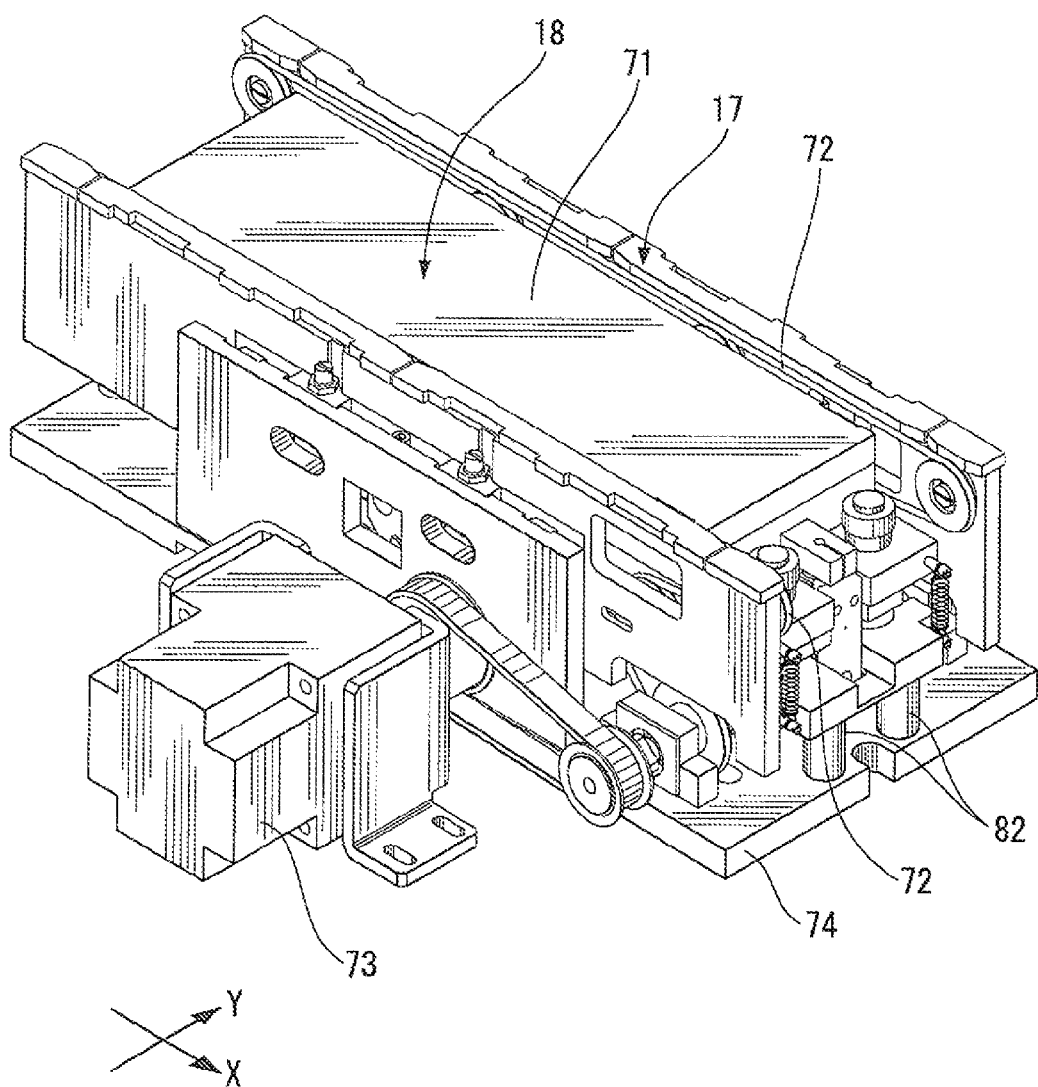
FIG. 16 is a perspective view of a mounting stage.
Figure 17:
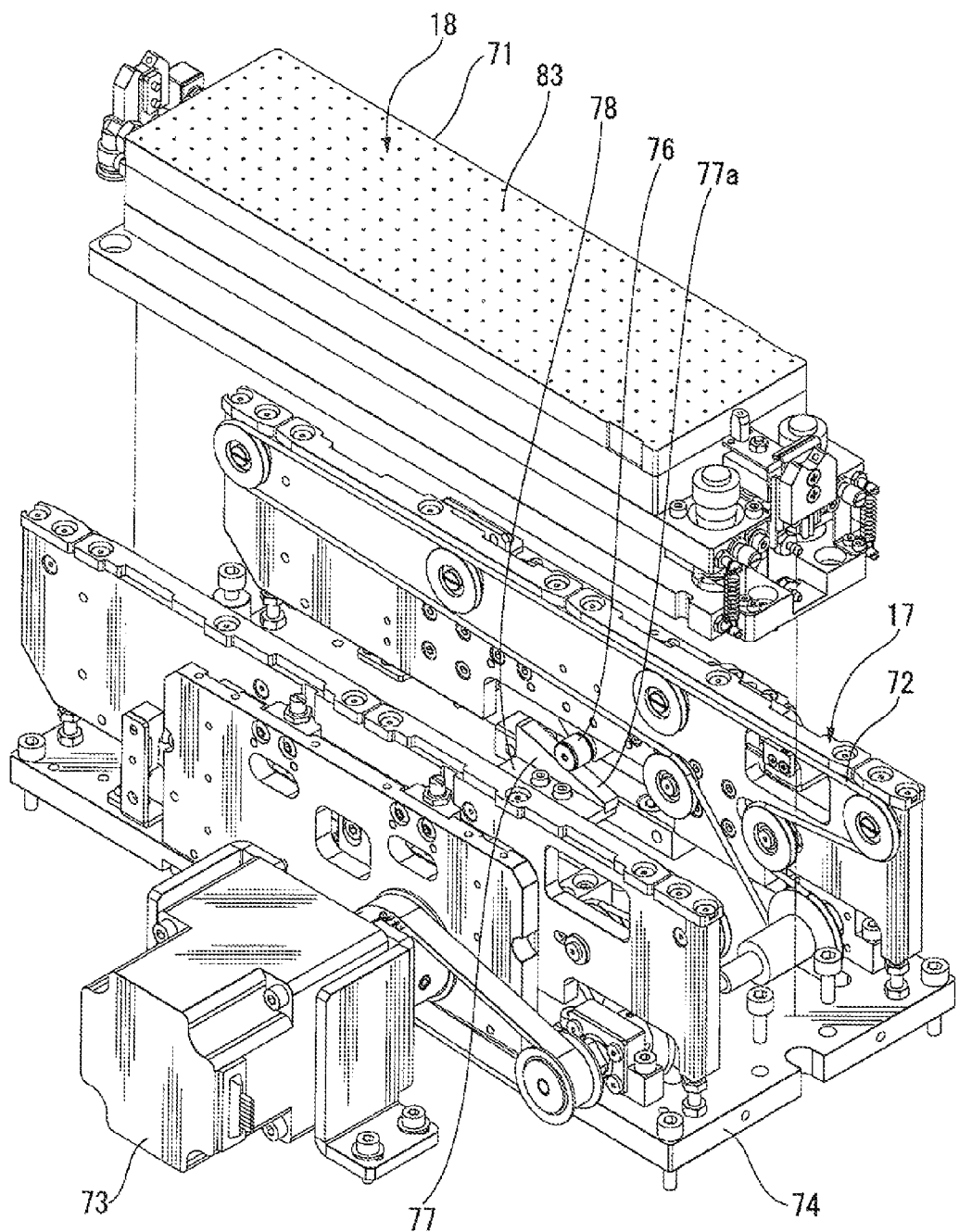
FIG. 17 is an exploded perspective view of the mounting stage.

The conveyor 17 and mounting stage 18 are disposed on each side of the moving direction change conveyor 32. The mounting stage 18 includes a mounting plate 71 inserted in the conveyor 17, as shown in FIGS. 16 and 17. The conveyor 17 serves to feed the printed circuit board 3 along the second conveyance lane L2, and includes a pair of belts 72 extending in a direction parallel to the X-direction. The belts 72 are arranged so as to support the side portions, as the long sides, of the printed circuit board 3, and rotate upon being driven by one driving motor 73.

Figure 18:
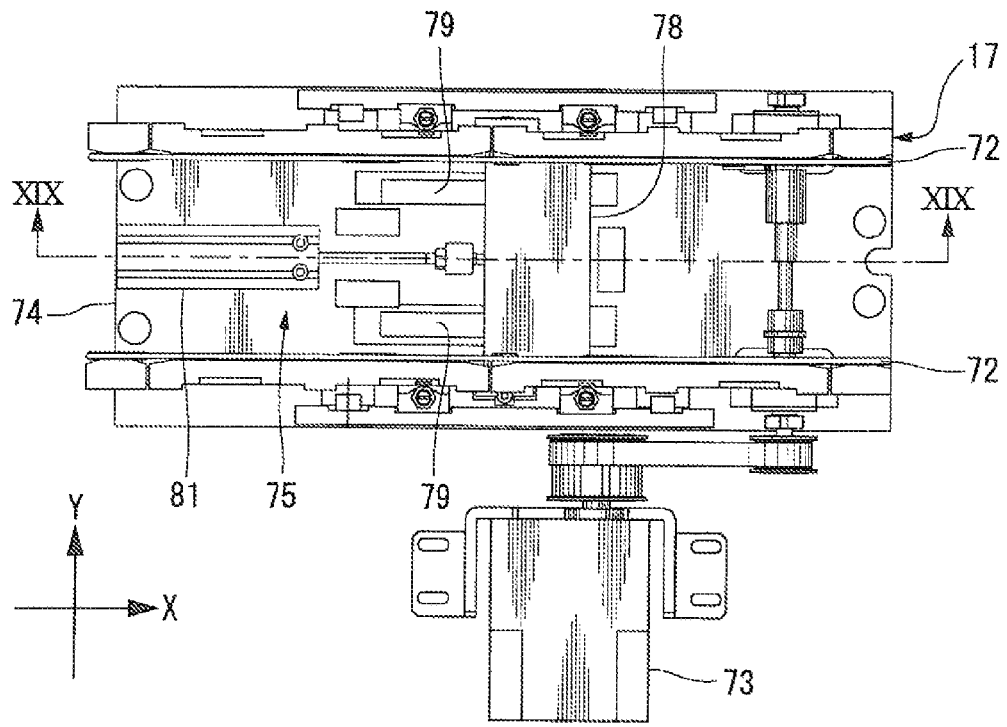
FIG. 18 is a plan view showing the state where a mounting plate of the mounting stage is removed.
Figure 19:
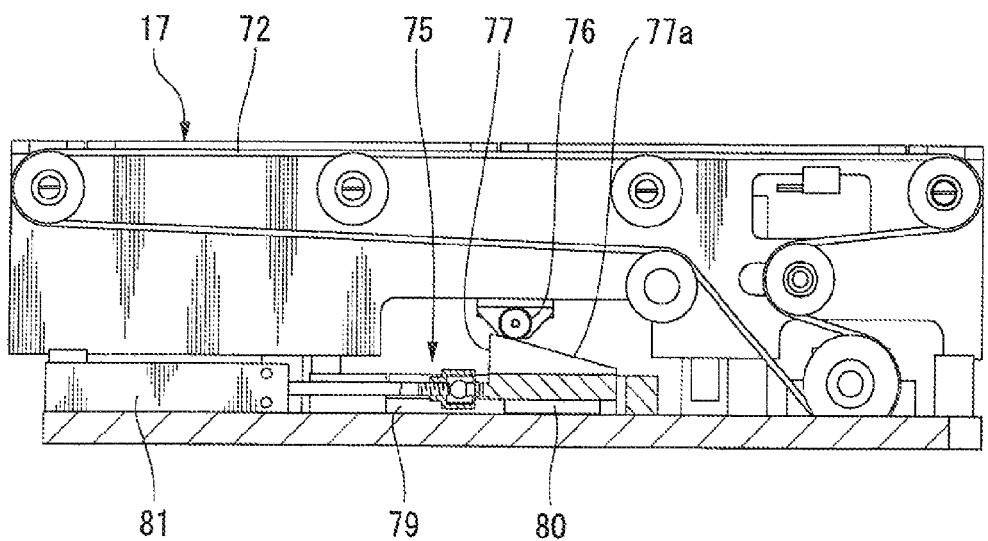
FIG. 19 is a sectional view taken along a line XIX-XIX in FIG. 18.

Also, the conveyor 17 is supported by a bottom plate 74 (see FIG. 17) of the mounting stage 18 to be vertically movable. The bottom plate 74 is held to the base 2, although not shown. The bottom plate 74 is provided with a lift mechanism 75 for vertically moving the conveyor 17, as shown in FIGS. 18 and 19. The lift mechanism 75 vertically moves a roller 76 (see FIGS. 17 and 19), disposed on the conveyor 17, using cams 77. The cam 77 has an inclined surface 77a on which the roller 76 rolls, and is disposed on the two side portions of the conveyor 17. The cams 77 are supported by the two end portions of a support plate 78 (see FIG. 18) extending in the Y-direction.

The support plate 78 is translatably supported by the bottom plate 74 through a guide rail 79 and a slider 80 (see FIG. 19). The direction in which the support plate 78 moves is parallel to the X-direction. The support plate 78 is connected to an air cylinder 81, and moves to the downstream or upstream side in the X-direction upon being driven by the air cylinder 81. As the support plate 78 and cam 77 move to the upstream or downstream side in the X-direction, the roller 76 of the conveyor 17 rolls on the inclined surface 77a, and the conveyor 17 vertically moves. In the state where the conveyor 17 has ascended, the upper surfaces of the belts 72 (the substrate support surface of the substrate holding unit 12) are positioned at the same level as that of the upper surfaces of the first and second belts 59 and 60 of the moving direction change conveyor 32. However, in the state where the conveyor 17 has descended, the upper surfaces of the belts 72 of the conveyor 17 are positioned at a level lower than that of the upper surface of the mounting plate 71.

The mounting plate 71 serves to place the printed circuit board 3 in mounting an electronic component on the printed circuit board 3, has an upper surface formed flatly, and is held on the bottom plate 74 through a leg member 82 (see FIG. 16). The lift mechanism 75 is disposed between the mounting plate 71 and the bottom plate 74.

A large number of small holes 83 (see FIG. 17) for air suction are formed in the mounting plate 71. The small holes 83 are connected to a suction air passage (not shown) in the plate 71. The suction air passage is connected to an air suction device (not shown). That is, the printed circuit board 3 is placed on the plate 71 while air is drawn into the plate 71 by suction from the small holes 83 to chuck and hold the printed circuit board 3 on the plate 71. An electronic component is mounted on the printed circuit board 3 while the printed circuit board 3 is held on the plate 71 in this way.

The second substrate moving unit 15 which feeds the printed circuit board 3 with the electronic component mounted thereon to the unloading unit 13 includes conveyors 42 for transferring the printed circuit board 3, and a moving mechanism 91 which translates the conveyors 42, as shown in FIGS. 20 to 25. A conveyor 92 (see FIG. 20) which constitutes the downstream or upstream end portion of the unloading unit 13 is attached to the moving mechanism 91 according to this embodiment so as to translate together with the conveyors 42 of the second substrate moving unit 15.

Figure 20:
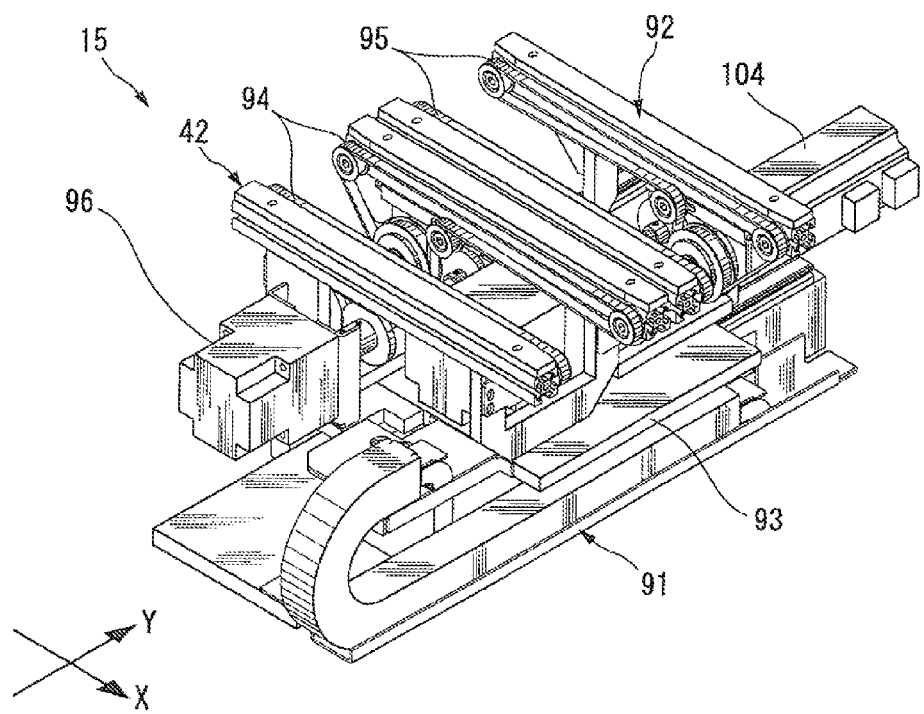
FIG. 20 is a perspective view of a second substrate moving unit.

The conveyors 42 of the second substrate moving unit 15, and the conveyors 92 of the unloading unit 13 are supported by one support plate 93 and connected to the moving mechanism 91 (to be described later) via the support plate 93, as shown in FIG. 20.

The conveyors 42 and 92 include belts 94 and 95 extending in a direction parallel to the X-direction. The belts 94 and 95 are arranged so as to support the side portions, as the long sides, of the printed circuit board 3, and rotate upon being driven by one driving motor 96.

The belts 94 of the second substrate moving unit 15 are configured so that the printed circuit board 3 can transfer from the conveyor 17 on the mounting stage side. That is, in the state where the conveyor 17 on the mounting stage side is set at an upper position, the upper surfaces of the belts 72 are almost flush with those of the belts 94 of the second substrate moving unit 15. In this embodiment, the conveyors 42 of the second substrate moving unit 15 correspond to a "second conveyor" according to the invention defined in claim 4.

To move the printed circuit board 3 from the side of the mounting stage 18 to the second substrate moving unit 15, the conveyor 17 on the side of the mounting stage 18 must move the printed circuit board 3 to the side of the second substrate moving unit 15. That is, the second substrate moving unit 15 according to this embodiment is configured using part (conveyor 17) of the substrate holding unit 12.

Figure 21:
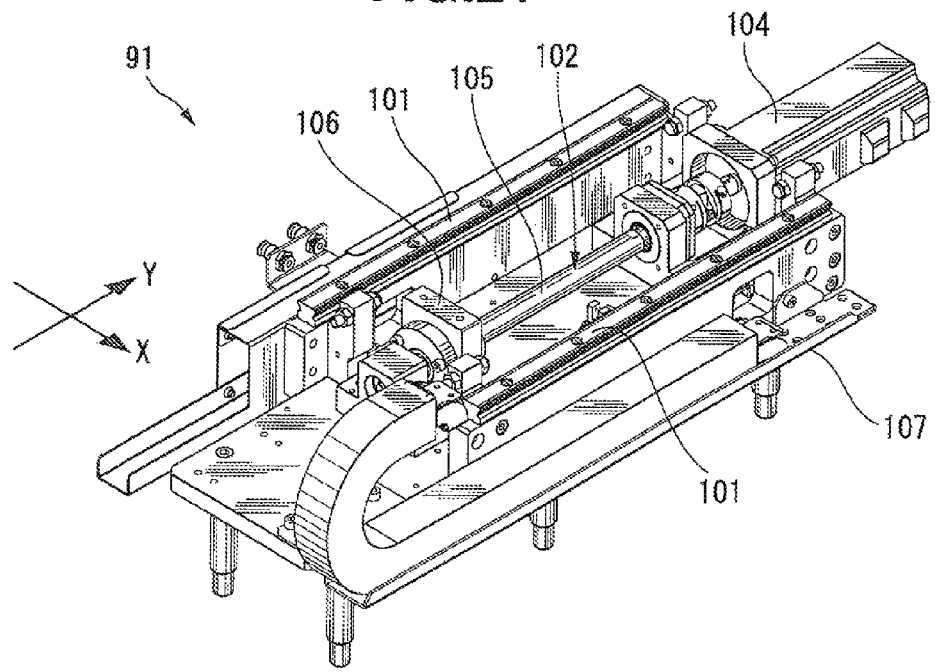
FIG. 21 is a perspective view showing the state where a support plate for the second substrate moving unit is removed.
Figure 22:
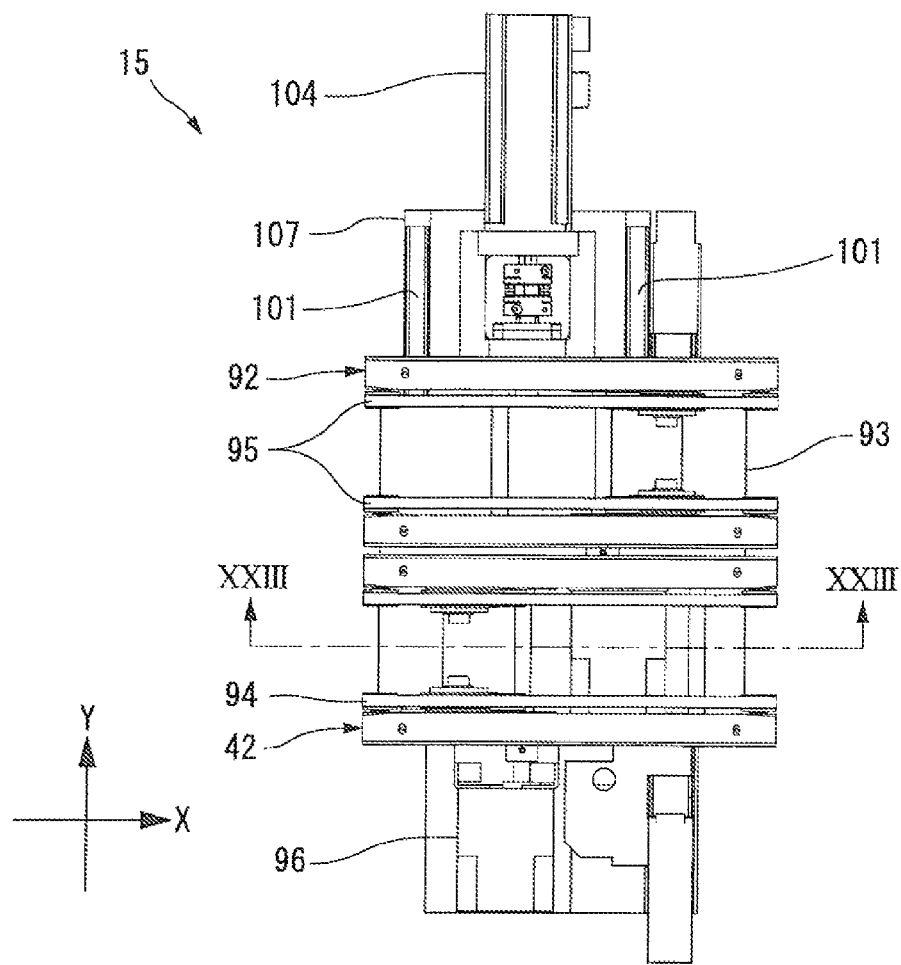
FIG. 22 is a plan view of the second substrate moving unit.

The moving mechanism 91 serves to reciprocally move the support plate 93 in a direction parallel to the Y-direction. The moving mechanism 91 according to this embodiment includes a pair of guide rails 101 extending in a direction parallel to the Y-direction, and a ball screw mechanism 102 inserted between the guide rails 101, as shown in FIG. 21.

The guide rails 101 are formed to extend from the second conveyance lane L2 to the third conveyance lane L3. In this embodiment, the guide rails 101 correspond to a "guide member" according to the invention defined in claim 4.

Figure 23:
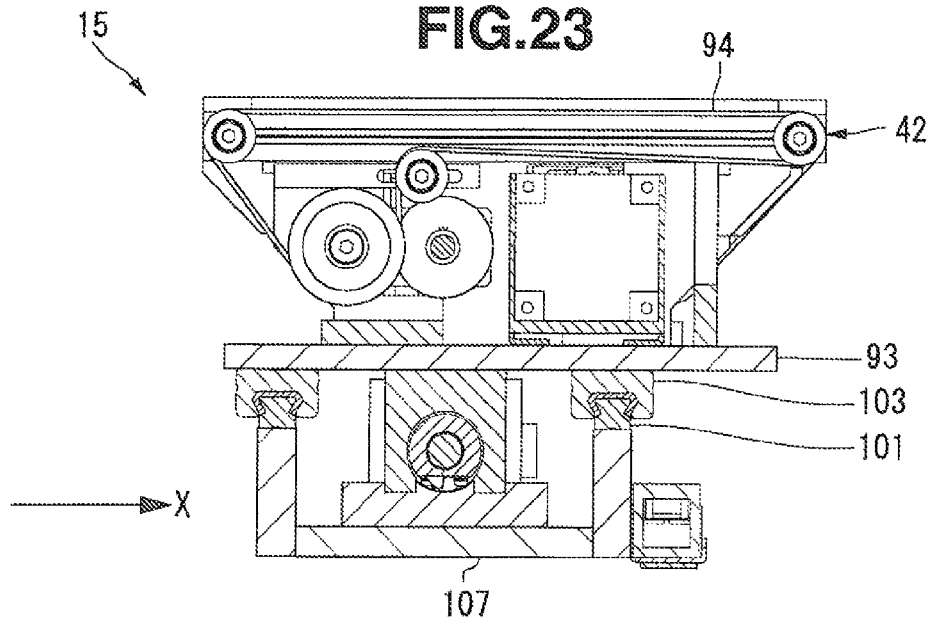
FIG. 23 is a sectional view taken along a line XXIII-XXIII in FIG. 22.
Figure 24:
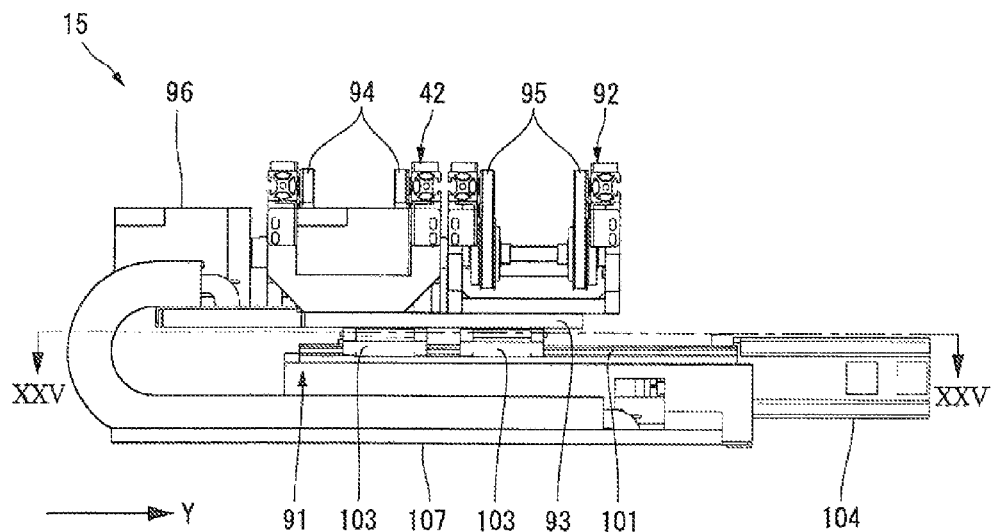
FIG. 24 is a side view of the second substrate moving unit.
Figure 25:
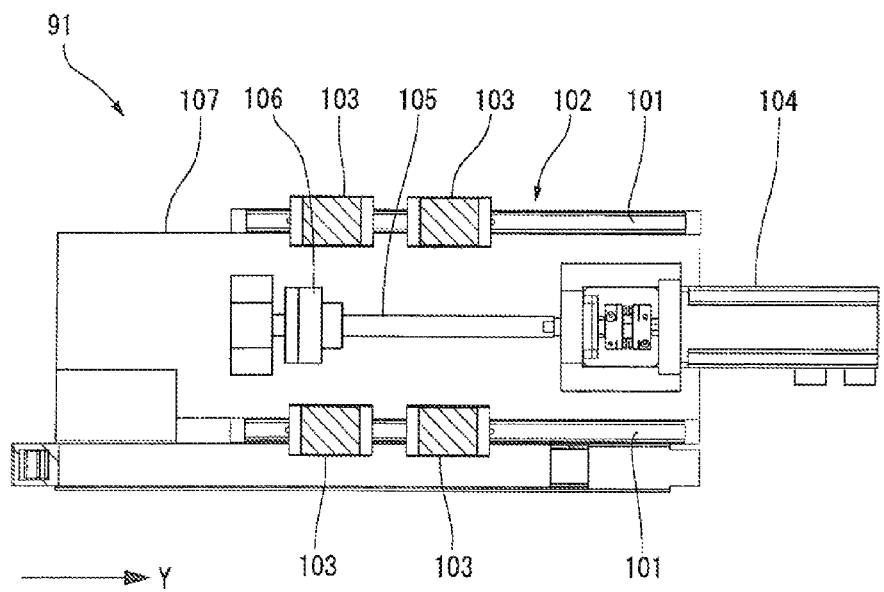
FIG. 25 is a plan view showing the state where a support plate for the second substrate moving unit is removed.

Sliders 103 are movably attached to the guide rails 101, as shown in FIGS. 23 to 25. The support plate 93 is held on the sliders 103.

The ball screw mechanism 102 includes a ball screw shaft 105 rotated by a motor 104, and a ball screw nut 106 which threadably engages with the ball screw shaft 105. The motor 104 and ball screw shaft 105 are supported so as not to move to a support table 107 of the moving mechanism 91.

The support plate 93 is attached to the ball screw nut 106. The support plate 93 and two conveyors 42 and 92 translate between the position of the upstream end in the Y-direction and that of the downstream end in the Y-direction as the ball screw shaft 105 rotates upon being driven by the motor 104.

In the state where the support plate 93 has moved to the position of the upstream end in the Y-direction, the conveyors 42 of the second substrate moving unit 15 are set at the same position in the Y-direction as that of the conveyors 17 on the side of the mounting stage 18, and the conveyors 92 at the two end portions of the unloading unit 13 are set at the same position in the Y-direction as that of the other conveyor 19 of the unloading unit 13, as shown in FIG. 9.

In the state where the support plate 93 has moved to the position of the downstream end in the Y-direction, the conveyors 42 of the second substrate moving unit 15 are set at the same position in the Y-direction as that of the other conveyor 19 of the unloading unit 13, although not shown. At this time, the conveyors 92 at the two end portions of the unloading unit 13 provided on the support plate 93 move to the outside (a side opposite to the second conveyance lane L2) of the other conveyor 19 of the unloading unit 13.

Note that the second substrate moving unit 15 in adopting the above-mentioned first and second embodiments can be configured by placing the mounting stage 18 on the support plate 93 shown in these embodiments.

With the substrate conveyance unit 4 configured as shown in FIGS. 9 to 25, the printed circuit board 3 of the loading unit 11 is placed on the belts 57 of the first substrate moving unit 14 and fed from the loading unit 11 to the substrate holding unit 12. Hence, according to this embodiment, the first substrate moving unit 14 can be formed to be relatively compact in the Y-direction, compared to the case wherein the first substrate moving unit 14 is of the stage movement type. This is because the first substrate moving unit of the stage movement type requires an interference avoidance area to avoid interference between the moving stage and the substrate holding unit 12.

Also, in this embodiment, when the printed circuit board 3 is fed from the loading unit 11 to the substrate holding unit 12, it is clamped by the belts 57 and rollers 55 of the first substance moving unit 14 and reliably follows the belts 57. Hence, according to this embodiment, a flexible printed circuit board 3 can be fed to the substrate holding unit 12 quickly and reliably.

The second substrate moving unit 15 according to this embodiment receives the printed circuit board 3 from the substrate holding unit 12 using the conveyors 17 and 42 which support the side portions, as the long sides, of the printed circuit board 3, and translates the conveyors 42 to feed the printed circuit board 3 to the unloading unit 13. With this arrangement, a film-like printed circuit board 3 is fed from the substrate holding unit 12 to the unloading unit 13 without flexure. Hence, according to this embodiment, high-quality component mounting can be done so that an electronic component mounted on the printed circuit board 3 does not move from a mounting position.

According to the present invention, a printed circuit board loaded by the loading unit is moved in the second horizontal direction by the first substrate moving unit and fed to the substrate holding unit. After an electronic component has been mounted on the printed circuit board by the substrate holding unit, it is fed to the unloading unit by the second substrate moving unit and unloaded in the first horizontal direction by the unloading unit. With this arrangement, since the printed circuit board moves in the second horizontal direction to mount an electronic component, an electronic component mounting apparatus compact in the first horizontal direction can be provided.

What is claimed is:

1. An electronic component mounting apparatus comprising:
    a loading unit configured to move a printed circuit board in a first horizontal direction to load the printed circuit board;
    a first substrate moving unit configured to move the printed circuit board, loaded by the loading unit, in a second horizontal direction perpendicular to the first horizontal direction;
    a substrate holding unit configured to temporarily hold the printed circuit board moved by the first substrate moving unit;
    a component mounting unit configured to mount an electronic component on the printed circuit board held by the substrate holding unit;
    a second substrate moving unit configured to move the printed circuit board with the electronic component mounted thereon in the second horizontal direction; and
    an unloading unit configured to move the printed circuit board, moved by the second substrate moving unit, in the first horizontal direction to unload the printed circuit board.

2. An apparatus according to claim 1, wherein the substrate holding unit comprises:
    a first conveyor configured to change a moving direction of the printed circuit board, moved by the first substrate moving unit, to one of the first horizontal direction and a direction opposite to the first horizontal direction; and
    a mounting stage which temporarily holds the printed circuit board fed by the first conveyor.

3. An apparatus according to claim 1, wherein the loading unit, the first substrate moving unit, the substrate holding unit, the second substrate moving unit, and the unloading unit are arranged in a line along the second horizontal direction.

4. An apparatus according to claim 1, wherein the second substrate moving unit comprises:
    a second conveyor which moves the printed circuit board from the substrate holding unit;
    a guide rail which extends in the second horizontal direction, and supports the second conveyor to be movable in the second horizontal direction; and
    a moving mechanism which translates the second conveyor along the guide rail, together with the printed circuit board.

5. An apparatus according to claim 1, wherein the first substrate moving unit ascends or descends between a first position higher than a substrate movement surface, along which the printed circuit board moves in the loading unit, and a substrate support surface, along which the printed circuit board is held in the substrate holding unit, and a second position lower than the substrate movement surface and the substrate support surface, and comprises a moving member which moves in the second horizontal direction to transfer the printed circuit board from the loading unit to the substrate holding unit at the first position.

6. An apparatus according to claim 1, wherein the second substrate moving unit is positioned to fall within a range in which an electronic component is mounted by the component mounting unit.

* * * * *